United States Patent
Bieber

(10) Patent No.: US 11,005,532 B2
(45) Date of Patent: May 11, 2021

(54) VARIABLE IMPEDANCE CIRCUIT

(71) Applicant: Solaredge Technologies Ltd., Herzeliya (IL)

(72) Inventor: Ofir Bieber, Ra'anana (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 16/817,941

(22) Filed: Mar. 13, 2020

(65) Prior Publication Data

US 2020/0274578 A1 Aug. 27, 2020

Related U.S. Application Data

(63) Continuation of application No. 16/225,212, filed on Dec. 19, 2018, now Pat. No. 10,630,342.

(60) Provisional application No. 62/611,006, filed on Dec. 28, 2017.

(51) Int. Cl.
| | |
|---|---|
| *H04B 3/56* | (2006.01) |
| *H04B 1/04* | (2006.01) |
| *H04B 1/16* | (2006.01) |
| *H04L 25/02* | (2006.01) |

(52) U.S. Cl.
CPC .............. *H04B 3/56* (2013.01); *H04B 1/04* (2013.01); *H04B 1/16* (2013.01); *H04L 25/0264* (2013.01); *H04B 2203/5404* (2013.01); *H04B 2203/5429* (2013.01); *H04B 2203/5483* (2013.01)

(58) Field of Classification Search
CPC ... H04B 3/56; H04B 1/04; H04B 1/16; H04B 2203/5404; H04B 2203/5429; H04B 2203/5488; H04L 25/0264

USPC .......................................................... 455/402
See application file for complete search history.

(56) References Cited

U.S. PATENT DOCUMENTS

| | | | | | |
|---|---|---|---|---|---|
| 4,455,674 A | * | 6/1984 | Sano | .................. | H03G 5/24 381/15 |
| 5,168,282 A | * | 12/1992 | Viereck | ................. | H04B 1/50 343/745 |
| 5,644,598 A | * | 7/1997 | Bidese | .................. | H04B 3/00 375/258 |

(Continued)

FOREIGN PATENT DOCUMENTS

EP  1850501 A1  10/2007

OTHER PUBLICATIONS

Mar. 13, 2019 European search report for EP App. 18214027.7.

*Primary Examiner* — William Nealon
(74) *Attorney, Agent, or Firm* — Banner & Witcoff, Ltd.

(57) ABSTRACT

A power line communication device including a current path provided between a first terminal and a second terminal. A coupling circuit includes a first circuit of a first inductor connected in parallel with a first capacitor and a first resistor, wherein the coupling circuit is connected between the first and second terminals. A sensor is configured to sense a communication parameter of the coupling circuit. The communication parameter may be a resonance of the first circuit, the quality (Q) factor of the resonance, the bandwidth (BW) of the coupling circuit, the resistance of the first resistor, or the impedance of the first circuit. A transceiver is adapted to couple to the first and second terminal to transmit a signal onto the current path or receive a signal from the current path responsive to the parameter of the coupling circuit and a level of current in the current path sensed by the sensor.

22 Claims, 18 Drawing Sheets

(56) References Cited

U.S. PATENT DOCUMENTS

| | | | | |
|---|---|---|---|---|
| 7,769,908 B2* | 8/2010 | Chan | ............... | H04B 3/542 |
| | | | | 709/218 |
| 8,755,946 B2* | 6/2014 | Xia | ............... | H04L 12/10 |
| | | | | 700/295 |
| 8,896,393 B2* | 11/2014 | Fiorelli | ............... | H03H 7/004 |
| | | | | 333/124 |
| 9,063,528 B2* | 6/2015 | Xia | ............... | G05B 13/02 |
| 2005/0085211 A1* | 4/2005 | Welles, II | ............... | H04B 3/54 |
| | | | | 455/402 |
| 2010/0204850 A1* | 8/2010 | Henderieckx | ............... | H04B 3/542 |
| | | | | 700/297 |
| 2015/0045977 A1* | 2/2015 | Xia | ............... | H04L 12/66 |
| | | | | 700/295 |

\* cited by examiner

VARIABLE IMPEDANCE CIRCUIT

RELATED APPLICATIONS

This application is a continuation of U.S. non-provisional application Ser. No. 16/225,212, entitled "Variable Impedance Circuit," filed Dec. 19, 2018, which claims priority to U.S. provisional application Ser. No. 62/611,006, entitled "Variable Impedance Circuit," filed Dec. 28, 2017, which is incorporated in its entirety herein by reference.

BACKGROUND

Electrical inductor design generally involves selecting a desired inductance (L) and a desired saturation current ($I_{sat}$), i.e., the current at which the inductor ceases to operate as an effective inductor. Often there is a tradeoff between achieving a high inductance and achieving a high saturation current. An inductor having both a high inductance and a high saturation current is often expensive and/or physically large and bulky. It would be desirable to have a circuit operable to function similarly to an inductor having a high inductance and high saturation current at a fraction of the cost and bulk of a passive inductor having the same properties.

Power-line communication (PLC) is a communication method that uses electrical wiring to simultaneously carry both data and electric power. It may also be known as power-line carrier, power-line digital subscriber line (PDSL), mains communication, power-line telecommunications, or power-line networking (PLN). Therefore, the electrical conductors of the electrical wiring may be used as a data line via the superposition of an information signal to the electrical power present on the electrical conductors. When designing circuits for effective PLC, it may be necessary to design for operation at a wide range of frequencies, to allow for frequency selection according to characteristics and parameters of the system incorporating PLC (e.g., the size of the system, noise sources, etc.), according to different modes of operation and according to the modulation scheme. PLC circuits effective across frequency ranges (e.g., tens of kilohertz) may be expensive and/or bulky. It would be desirable to have a PLC circuit that can be adapted for operation at various frequencies at a low cost.

SUMMARY

The following summary is a short summary of some of the inventive concepts for illustrative purposes only, and is not intended to limit or constrain the inventions and examples in the detailed description. One skilled in the art will recognize other novel combinations and features from the detailed description.

Aspects of the disclosure herein may include circuits operable to present a circuit functionally equivalent to an inductor having a high inductance value (L) and a high saturation current value ($I_{sat}$). For brevity, an inductor having a having a high inductance value and a high saturation current value will be referred to as a "HLHI" (acronym for High-L-High-Isat). Active impedance circuits emulating a HLHI may be variously realized. According to some aspects, an inductor having high inductance and low saturation current (HLLI) may be complemented by a current compensation circuit to prevent saturation of the inductor core. According to some aspects, an inductor having low inductance and high saturation current (LLHI) may be complemented by an adjustable capacitor circuit to present an effective impedance equivalent to a larger inductor. According to some aspects, two inductors may be combined—one HLLI inductor provided for operation at low or close to zero current, and one adjustable LLHI inductor provided along with a compensation circuit for operation at high current, when the HLLI inductor is saturated. According to some aspects, more than two inductors may be combined. For example, two or more adjustable LLHI circuits may be used to provide a high impedance value at multiple frequencies.

A requirement of a power system may be to ensure an efficient delivery of power to a load. To enable the efficient delivery, monitoring of the system may include sensed parameters (e.g., voltages, currents and impedance sensed by sensors of components of the power system) that may be conveyed to a controller for analysis. The result of the analysis may be the sending of control signals responsive to the analysis to the components of the power system. The components may include sources of direct current (DC) power and/or sources of (AC) power such as photovoltaic (PV) generators, wind power turbines, DC generators and/or batteries. DC to DC converters may connected to the DC sources, and the outputs of the DC to DC converters may connected together to provide multiple strings that may be connected across a load. The load may be a DC to alternating current (AC) inverter that has an output that may be connected to a utility grid or a localized grid that may be separate from the utility grid.

The control signals as a result of the analysis may ensure that inter-connected components of the power system perform in concert to ensure efficient delivery of power to a load. The conveying of monitoring and control signals may provide a dynamic way of increasing efficient delivery of power to a load by use of adaptive and/or robust control methods based on the measured parameters and the control signals. The use of adaptive and/or robust control methods may include consideration of shading of PV generators, of PV generators operating at low irradiance levels such as at dusk or dawn, of a faulty power converter or of a battery that may have a change of status (e.g., becoming a load requiring charging by the power system). A way of conveying signals for monitoring and controlling the components of the power system may be by power line communications (PLC). PLC utilizes the power lines that inter-connect the components of the power system to simultaneously carry both data included in the monitoring and control signals, and delivery of electrical power to the load.

Monitoring and control signals may provide a dynamic way of providing efficient delivery of power to a load by use of adaptive and/or robust control if the method of conveying signals for monitoring and controlling the components of the power system is reliable. Diminished reliability of communications over power lines using PLC may be due to various factors. The various factors may include the effects of unwanted noise present on power lines due to the switching of power converters that may corrupt the data of the communication signals. The dynamic way of providing efficient delivery of power to a load (e.g., varying the current carried by a cable of the power system) may also further cause of a mismatch between the impedance of PLC circuitry/power line communication device and the impedance of power lines that provide a channel for communication that may be constantly changing. Therefore, transmission of a communication signal by a transceiver may be absorbed and attenuated by another receiving transceiver. A feature of PLC circuitry may be to provide an impedance that may reduce absorption and attenuation of transmitted signals. The feature may further include adjustability of the PLC circuitry to enable increased transmission efficiency of a signal onto the power lines as well as to receive the signal from the power lines with reduced absorption and attenuation of transmitted signals.

A possible further problem may be that the power from the power system is insufficient to provide power to operate power line communication circuitry in an adjustable manner in order to enable increased transmission efficiency of a signal onto the power lines. Therefore, PLC circuitry may additionally provide the capability to operate with an operating power from an auxiliary source of supply independent from operating power from the power system or provide the operating power from both the power from the power system and/or the auxiliary source. The provision of operating power may be responsive to both the sensed powers of the power system in terms of voltages, currents, impedances, irradiance levels of PV generators, charge levels of charge storage devices, windspeed and the sensed communication parameters. The communication parameters may include the resonances of the PLC circuitry, the Q factor of the resonances, the bandwidths (BW) of the PLC circuitry, the impedances of the PLC circuitry, and the standing wave ratio (SWR) of the transmission of signals onto the power lines. The PLC circuitry may additionally include a matching network that may also be adjustable to ensure an improved signal transmission efficiency of a transmitted signal and the receiving of the transmitted signal.

According to at least one aspect, there is provided a power line communication device that includes a coupling circuit. The coupling circuit includes a first circuit comprising a first inductor connected in parallel with a first capacitor and a first resistor, wherein the coupling circuit is connected between a first terminal and second terminal and is connected to a current path. The power line communication device includes a sensor configured to sense a communication parameter of the coupling circuit, wherein the communication parameter is selected from the group of communication parameters comprising at least one of a resonant frequency of the first circuit, the quality (Q) factor of resonance corresponding to the resonant frequency, the bandwidth (BW) of the coupling circuit, the resistance of the first resistor or the impedance of the first circuit. The power line communication device also includes a transceiver adapted to couple to the first terminal and the second terminal to, responsive to the communication parameter of the coupling circuit and a level of current in the current path sensed by the sensor, transmit a signal onto the current path or to receive a signal from the current path.

According to at least one aspect, there is provided a method to enable power line communications between a plurality of interconnected current paths provided between first and second terminals. The method includes connecting coupling circuits in each of the current paths between the first and second terminals, wherein each of the coupling circuits include at least one of first circuits and second circuits connected in series, wherein the first circuits include a first inductor connected in parallel with a first capacitor and a first resistor, and the second circuits include a second inductor connected in parallel with a second capacitor and a second resistor. The method also includes coupling a plurality of transceivers to the first and second terminals. The method further includes sensing communication parameters for each of the coupling circuits. The method still further includes transmitting signals onto the current paths or receiving signals from the current paths responsive to the communication parameters of the coupling circuits and to the levels of currents in the current paths.

According to at least one aspect, there is provided a method to enable power line communications using a current path provided between first and second terminals. The method includes connecting a first coupling circuit in the current path between the first and second terminals, wherein the coupling circuit includes a first circuit of a first inductor connected in parallel with a first capacitor and a first resistor. The method also includes coupling a transceiver to the first and second terminals. The method further includes sensing, by a sensor, a communication parameter for the first coupling circuit. The method still further includes transmitting at least one signal onto the current path or receiving at least one signal from the current path responsive to the communication parameter of the first coupling circuit and the level of current in the current path.

As noted above, this Summary is merely a summary of some of the features described herein. It is not exhaustive, and it is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

Figure 1A:
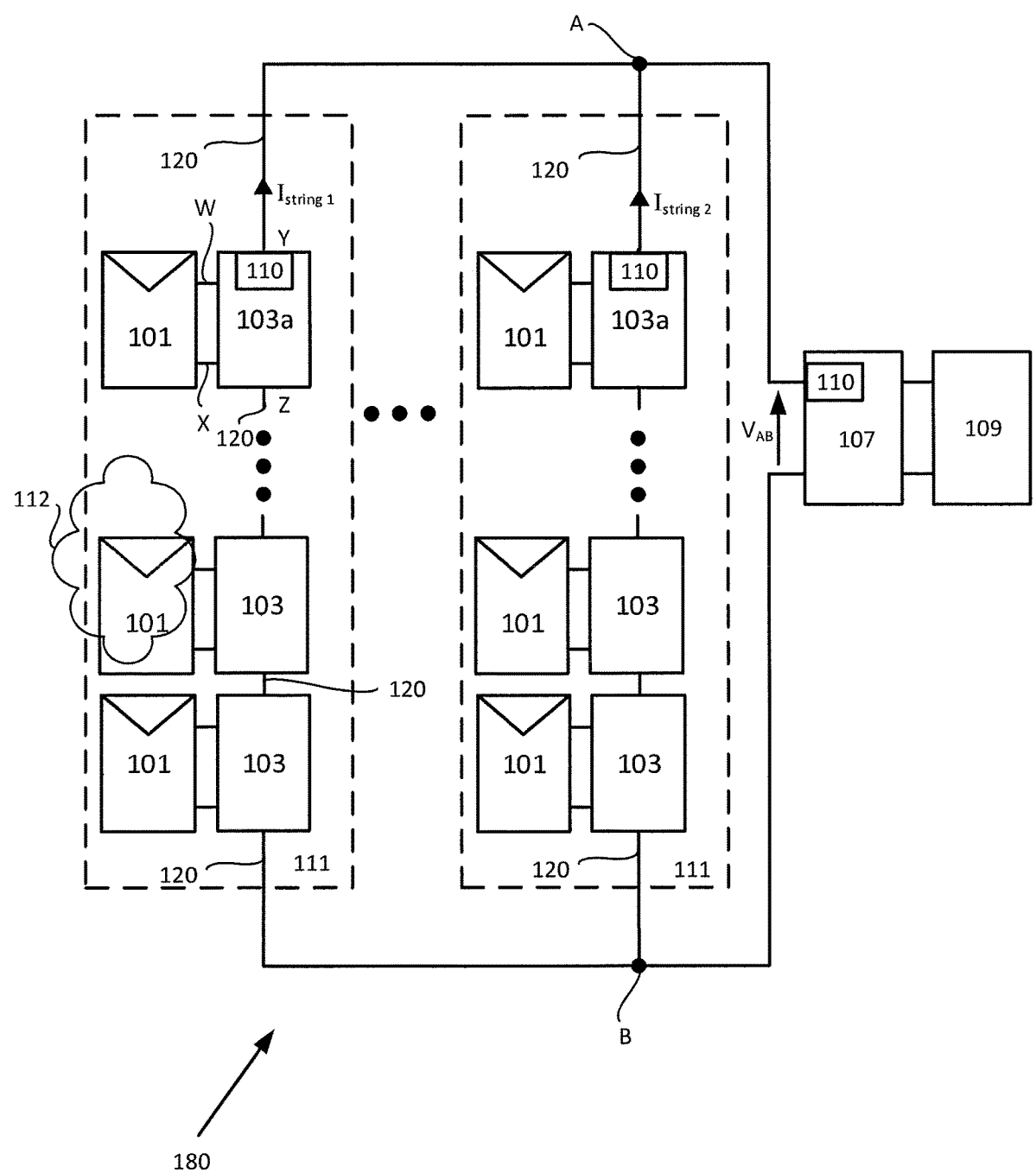
FIG. 1A shows a block diagram of a power system, according to illustrative aspects of the disclosure.

In the following description of various illustrative aspects of the disclosure, reference is made to the accompanying drawings, which form a part hereof, and in which is shown, by way of illustration, various aspects of the disclosure in which aspects of the disclosure may be practiced. It is to be understood that other aspects of the disclosure may be utilized and structural and functional modifications may be made, without departing from the scope of the present disclosure.

The term "multiple" as used here in the detailed description indicates the property of having or involving several parts, elements, or members. The claim term "a plurality of" as used herein in the claims section finds support in the description with use of the term "multiple" and/or other plural forms. Other plural forms may include, for example, regular nouns that form their plurals by adding either the letter 's' or 'es' so that the plural of converter is converters or the plural of switch is switches, for example.

A brief description of electronic circuits and features of electronic circuits are provided below, to aid in the explanation of various aspects of the disclosure described in detail hereinbelow. Electronic circuits such as transformers and inductors with ferromagnetic and/or ferrimagnetic cores may operate nonlinearly. The nonlinear operation may be due to when the current through an inductor, for example, is large enough to drive its core material into saturation. Saturation is the state reached when an increase in applied external magnetic field (H) cannot increase the magnetization of a ferromagnetic and/or ferrimagnetic material further, so the total magnetic flux density (B) more or less levels off. Examples of ferromagnetic and/or ferrimagnetic materials, include materials such as iron, nickel, cobalt and their alloys. Therefore, inductance of an inductor and other properties of the inductor may vary with changes and levels of the current in the indictor.

The quality factor "Q", of a resonant circuit is a measure of the "goodness" or quality of a resonant circuit to resonate as a result of the application of a signal to the resonant circuit. A higher value Q may correspond to a narrower bandwidth so that the range of frequencies applied to the resonant circuit may be limited compared to a resonant circuit with a lower Q, both of which may desirable in many applications. In a parallel resonant circuit (inductor connected in parallel with a capacitor), signal current through the inductor or capacitor may be Q times the total applied signal current.

The quality factor or the Q factor of an inductor at an operating frequency is defined as the ratio of inductive reactance of the coil ($X_L$) to its resistance. Increased resistance of coil decreases the Q of the coil. Resistance of a coil may be due to standard DC resistance, the skin effect or the intensity of the presence of the magnetic field in the vicinity of the coil. Standard DC resistance may be reduced by thicker wires, and sometimes silver or gold-plated wires may be used. The skin effect affects the inductor Q because it has the effect of raising its resistance. The skin effect may result from the tendency of a current flow of a signal or alternating current through the outer cross-sectional area of a conductor rather than through the middle. The skin effect may be due to opposing eddy currents induced by the changing magnetic field resulting from the signal and/or alternating current. Reduction of the cross-sectional area of the conductor through which a current can flow effectively increases the resistance of a conductor. It may be found that the skin effect becomes more pronounced with increasing frequency and intensity of the presence of the magnetic field (H). Magnetic hysteresis is another effect that causes losses and can reduce inductor Q factor values. The hysteresis of any magnetic material used as a core needs to be overcome with every cycle of the alternating current/signal and hence the magnetic field that manifests itself as another element of resistance. As ferrite materials are known for hysteresis losses, the effect on the inductor quality factor can be minimized by the careful choice of ferrite or other core material. The effect on the inductor quality factor can also be minimized by ensuring that the magnetic field induced is within the limits of the core material specified.

Features of the present disclosure may be directed to circuitry to provide power line communications between components of a power system. Part of the circuitry may provide adjustment of the circuitry parameters. The adjustment may be responsive to the sensed power conveyed in the power lines of the power system and/or communication parameters, to enable increased transmission efficiency of a signal onto the power lines. Transmission efficiency may be defined as the ratio of the power received by a communication device over a transmission path that includes the powerlines, to the power transmitted by another communication device, where each communication device may include the circuitry that provides adjustment of circuitry parameters.

Reference is now made to FIG. 1A, which illustrates a power system 180 and details of wiring configurations 111 and corresponding connections to system power device 107, according to illustrative aspects of the disclosure. System power device 107 may be a power converter (e.g., a direct current (DC) to alternating current (AC) inverter), a combiner box, and/or a monitoring, control and communications device. Load 109 may be a utility grid or other load (e.g., an AC motor). Multiple wiring configurations 111 are shown connected in parallel at terminals A and B that connect to the input of system power device 107 and provide voltage input $V_{AB}$ to the input of system power device 107. The output of system power device 107 may connect to load 109. Each wiring configuration 111 may include one or more power sources 101 that may be connected to a respective power device 103 and/or power device 103a at terminals W, X. The outputs of power devices 103/103a at terminals Y, Z may be connected together to form a serial string that connects between terminals A and B. Communication devices 110 are shown connected to system power device 107 and may also be connected to power device 103a. Communication device 110 may be an integrated part of system power devices 107/power devices 103 and/or retrofit to system power devices 107/power devices 103. Features of communication device 110 are described in greater detail below in the descriptions that follow.

According to some aspects of the disclosure, one or more wiring configurations 111 might not include power devices 103a or 103. For example, a wiring configuration 111 may include multiple power sources 101 directly connected in series or in parallel. For example, a wiring configuration 111 may have ten, twenty or thirty serially-connected photovoltaic panels. According to some aspects of the disclosure, a wiring configuration 111 may include a first group of one or more directly connected power sources 101, with a second group of one or more power sources 101 connected via power devices 103a or 103 connected to the first group. This arrangement may be useful in power installations where some power sources 101 may be susceptible to factors that reduce power generation (e.g., PV generators that are occasionally shaded by shade 112, wind turbines that occasionally suffer from a reduction in wind and/or with other power sources 101 less susceptible to power-reducing factors.

According to some aspects of the disclosure (e.g., in power system 181 of FIG. 1B), each power source 101 may be connected to a power device 103a having a communication device 110. In power system 180 as shown in FIG.

1A, a single power source 101 in each wiring configuration 111 is connected to a power device 103a, and other power sources 101 in the wiring configuration are connected to a power device 103 that might not include communication device 110. Providing each power device with a communication device may increase the control and communication capabilities of power system 180 (e.g., by enabling reception of commands and/or transmission of command and measurements by each power device 103), but may increase system cost. Aspects of the disclosure herein are applicable to systems having communication capabilities at each power device, and also systems having a single communication device in each wiring configuration 111.

According to some aspects of the disclosure, a communication device 110 may be located near to terminal B that may be grounded, so that from a signal perspective, both transmission and reception of signals may be with respect to a ground.

Figure 1B:
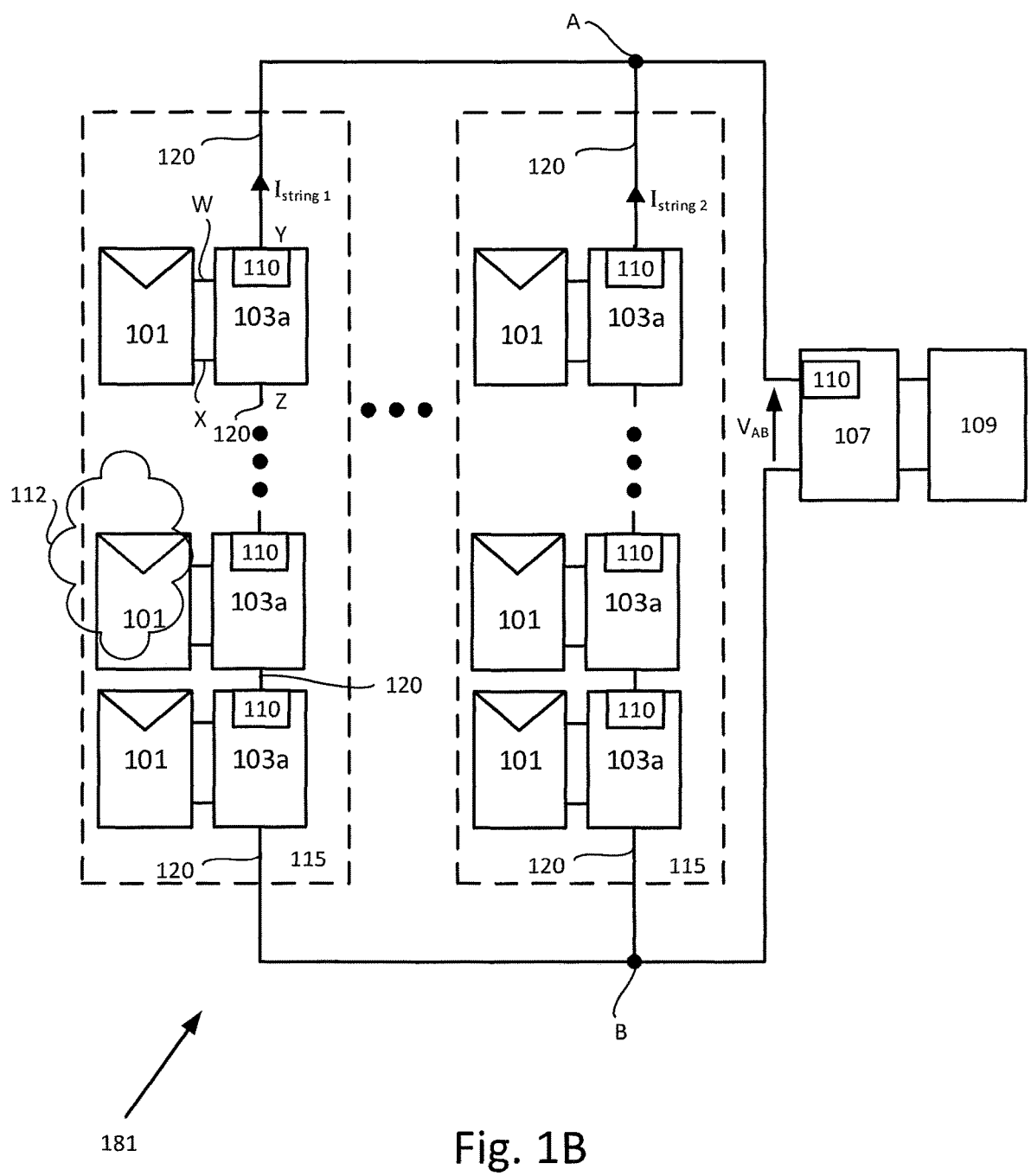
FIG. 1B shows a block diagram of a power system, according to illustrative aspects of the disclosure.

Reference is now made to FIG. 1B, which illustrates a power system 181 and details of wiring configurations 115 and corresponding connections to system power device 107, according to illustrative aspects of the disclosure. System power device 107 may be the same as system power device 107 of FIG. 1A. Wiring configurations 115 comprise multiple serially-connected photovoltaic power devices 103a, each power device 103a receiving input power from a connected power source 101, and each power device 103a comprising a communication device 110. Each of communication devices 110 may be configured to communicate with one another and/or with system power device 107 by transmitting and/or receiving signals over power lines 120.

In description above with respect FIGS. 1A and 1B, in general, any number of communication devices 110 may be located at various locations of power systems 180/181, for example on the outputs of power sources 101 and/or load 109.

Figure 1C:
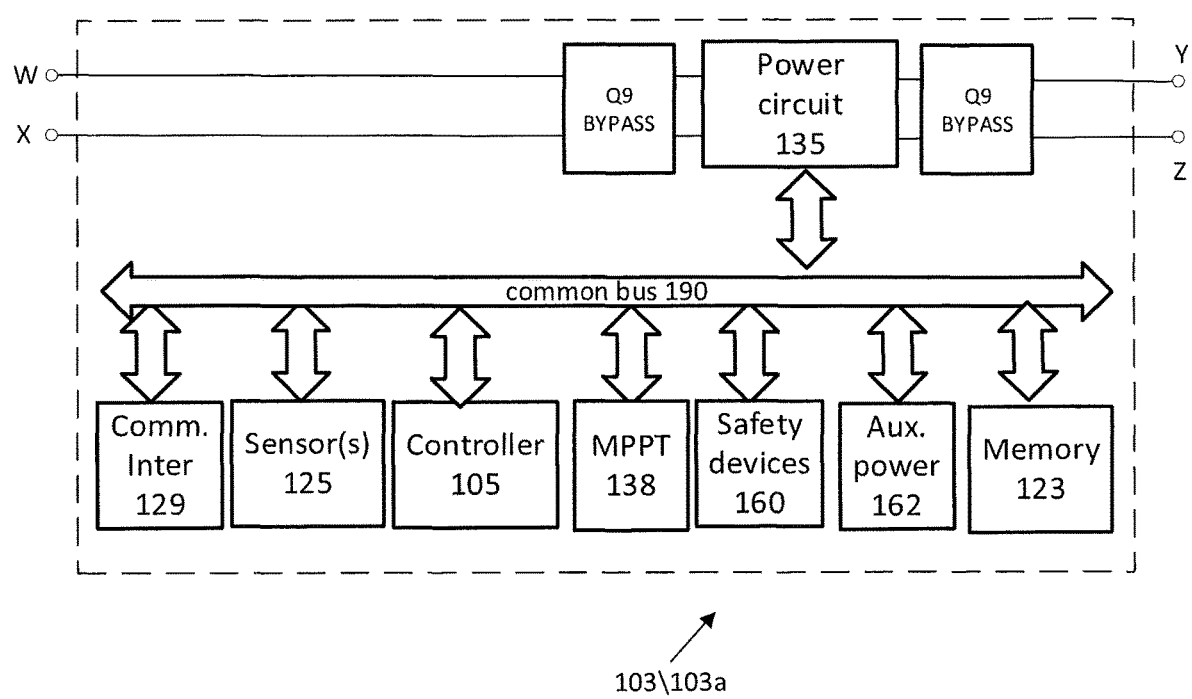
FIG. 1C illustrates circuitry that may be found in a power device, according to illustrative aspects of the disclosure.

Reference is now made to FIG. 1C, which illustrates circuitry that may be found in a power device such as power devices 103/103a, according to illustrative aspects of the disclosure. Power device 103/103a may be similar to or the same as power devices 103/103a shown in FIG. 1A that may provide respective input and output terminals W, X and Y, Z. Input terminals W, X and output terminals Y, Z may provide connection to power lines 120 (not shown). According to some aspects of the disclosure, power devices 103/103a may include power circuit 135. Power circuit 135 may include a direct current-direct current (DC/DC) converter such as a Buck, Boost, Buck/Boost, Buck+Boost, Boost+Buck, Cuk, Flyback and/or forward converter, or a charge pump. According to some aspects of the disclosure, power circuit 135 may include a direct current to alternating current (DC/AC) converter (also known as an inverter), such as a micro-inverter. Power circuit 135 may have two input terminals and two output terminals, that may be the same as the input terminals and output terminals of power device 103/103a. According to some aspects of the disclosure, power device 103/103a may include Maximum Power Point Tracking (MPPT) circuit 138, configured to extract increased power from a power source.

According to some aspects of the disclosure, power circuit 135 may include MPPT functionality. According to some aspects of the disclosure, MPPT circuit 138 may implement impedance matching algorithms to extract increased power from a power source. The power device may be connected to power device 103/103a and may further include controller 105 such as a microprocessor, Digital Signal Processor (DSP), Application-Specific Integrated Circuit (ASIC), and/or a Field Programmable Gate Array (FPGA).

Still referring to FIG. 1C, controller 105 may control and/or communicate with other elements of power devices 103/103a over common bus 190. According to some aspects of the disclosure, power devices 103/103a may include circuitry and/or sensors/sensor interfaces 125. Power devices 103/103a and/or sensors/sensor interfaces 125 may be configured to measure operating power parameters directly or receive measured operating power parameters from connected sensors and/or sensor interfaces 125. Sensors and/or sensor interfaces 125 may be configured to measure operating power parameters on or near the power source, such as the voltage and/or current output by the power source and/or the power output by the power source. According to some aspects of the disclosure, the power source may be a photovoltaic (PV) generator comprising PV cells, and a sensor or sensor interface may directly measure or receive measurements of the irradiance received by the PV cells, and/or the temperature on or near the PV generator.

Still referring to FIG. 1C, according to some aspects of the disclosure, power devices 103/103a may include communication interface 129, configured to transmit and/or receive data and/or commands from other devices. Communication interface 129 may communicate using Power Line Communication (PLC) technology, acoustic communications technology, or additional technologies such as ZIGBEE™, Wi-Fi, BLUETOOTH™, cellular communication, or other wireless methods. Power Line Communication (PLC) may be performed over power lines 120 between power devices 103/103a and system power device (e.g., inverter) 107 that may include a similar communication interface as communication interface 129. Communication interface 129 may be the same as or used as communication device 110 of FIG. 1A.

According to some aspects of the disclosure, power device 103/103a may include memory device 123, for logging measurements taken by sensor(s)/sensor interfaces 125 to store code, operational protocols or other operating information. Memory device 123 may be flash memory, Electrically Erasable Programmable Read-Only Memory (EEPROM), Random Access Memory (RAM), Solid State Devices (SSD), or other types of appropriate memory devices.

Still referring to FIG. 1C, according to some aspects of the disclosure, power device 103/103a may include safety device(s) 160 (e.g., fuse(s), circuit breaker(s) and Residual Current Detector(s)). Safety devices 160 may be passive or active. For example, safety devices 160 may include one or more passive fuses disposed within power devices 103/103a. The elements of the fuses may be designed to melt and disintegrate when excess current above the rating of the fuses flows through them. The melting of the fuses thereby disconnects parts of power devices 103/103a from terminals Y, Z, W and X so as to avoid damage to power device 103/103a and other components of power systems 180/181. According to some aspects of the disclosure, safety devices 160 may include active disconnect switches, configured to receive commands from a controller (e.g., controller 105, or an external controller) to short-circuit and/or disconnect portions of power devices 103/103a, or configured to short-circuit and/or disconnect portions of power devices 103/103a in response to a measurement measured by a sensor (e.g., a measurement measured or obtained by sensors/sensor interfaces 125). According to some aspects of the disclosure, power devices 103/103a may include auxiliary power circuit 162, configured to receive power (from a power source connected to power devices 103/103a, and to output power suitable for operating other circuitry components (e.g., controller 105, communication interface 129, etc.). Communication, electrical connecting and/or data-sharing between the various components of power devices 103/103a may be carried out over common bus 190. According to some aspects of the disclosure, auxiliary power circuit 162 may be connected to an output of a power devices 103/103a and designed to receive power from power sources connected to other power devices.

Power device 103/103a may include or be operatively attached to a maximum power point tracking (MPPT) circuit 138. The MPPT circuit may also be operatively connected to controller 105 or another controller 105 included in power device 103/103a that may be designated as a primary controller. A primary controller in power device 103/103a may communicatively control one or more other power devices 103/103a that may include controllers known as secondary controllers. Once a primary/secondary relationship may be established, a direction of control may be from the primary controller to the secondary controllers. The MPPT circuit under control of a primary and/or central controller 105 may be utilized to increase power extraction from power sources 101 and/or to control voltage and/or current supplied to system power device (e.g., an inverter or a load) 107.

Referring still to FIG. 1C, according to some aspects of the disclosure, power device 103/103a may include bypass unit Q9 coupled between the inputs of power circuit 135 and/or between the outputs of power circuit 135. Bypass unit Q9 and/or power circuit 135 may be integrated in a combiner box to terminate power lines 120 or to provide one or more safety devices such as fuses or residual current devices. Bypass unit Q9 may also be an isolation switch. Bypass unit Q9 may be a passive device (for example, a diode). Where bypass unit Q9 is an active device, bypass unit Q9 may be controlled by controller 105. If an unsafe condition is detected, controller 105 may set bypass unit Q9 to ON, short-circuiting the input and/or output of power circuit 135. In a case in which the pair of power sources 101 are photovoltaic (PV) generators, each PV generator provides an open-circuit voltage at its output terminals. When bypass unit Q9 is ON, a PV generator may be short-circuited, to provide a voltage of about zero to power circuit 135. In both scenarios, a safe voltage may be maintained, and the two scenarios may be staggered to alternate between open-circuiting and short-circuiting PV generators. This mode of operation may allow continuous power supply to system control devices, as well as provide backup mechanisms for maintaining a safe voltage (i.e., operation of bypass unit Q9 may allow continued safe operating conditions).

According to some aspects of the disclosure, a power device 103/103a may comprise a partial group of the elements illustrated in FIG. 1B. For example, a power device 103/103a might not include power circuit 135 (i.e., power circuit 135 may be replaced by a short circuit, and a single bypass unit Q9 may be featured. In a scenario where power circuit 135 is not present, power device 103/103a may be still used to provide safety, monitoring and/or bypass features.

According to some aspects of the disclosure, when a bypass unit Q9 is activated, a voltage drop of several 10s or 100s of millivolts may develop across bypass unit Q9. The voltage drop across bypass unit Q9 may be used as auxiliary power for continued activation of bypass unit Q9 and/or operation of an adjustable impedance circuit, as disclosed in further detail below.

Figure 1D:
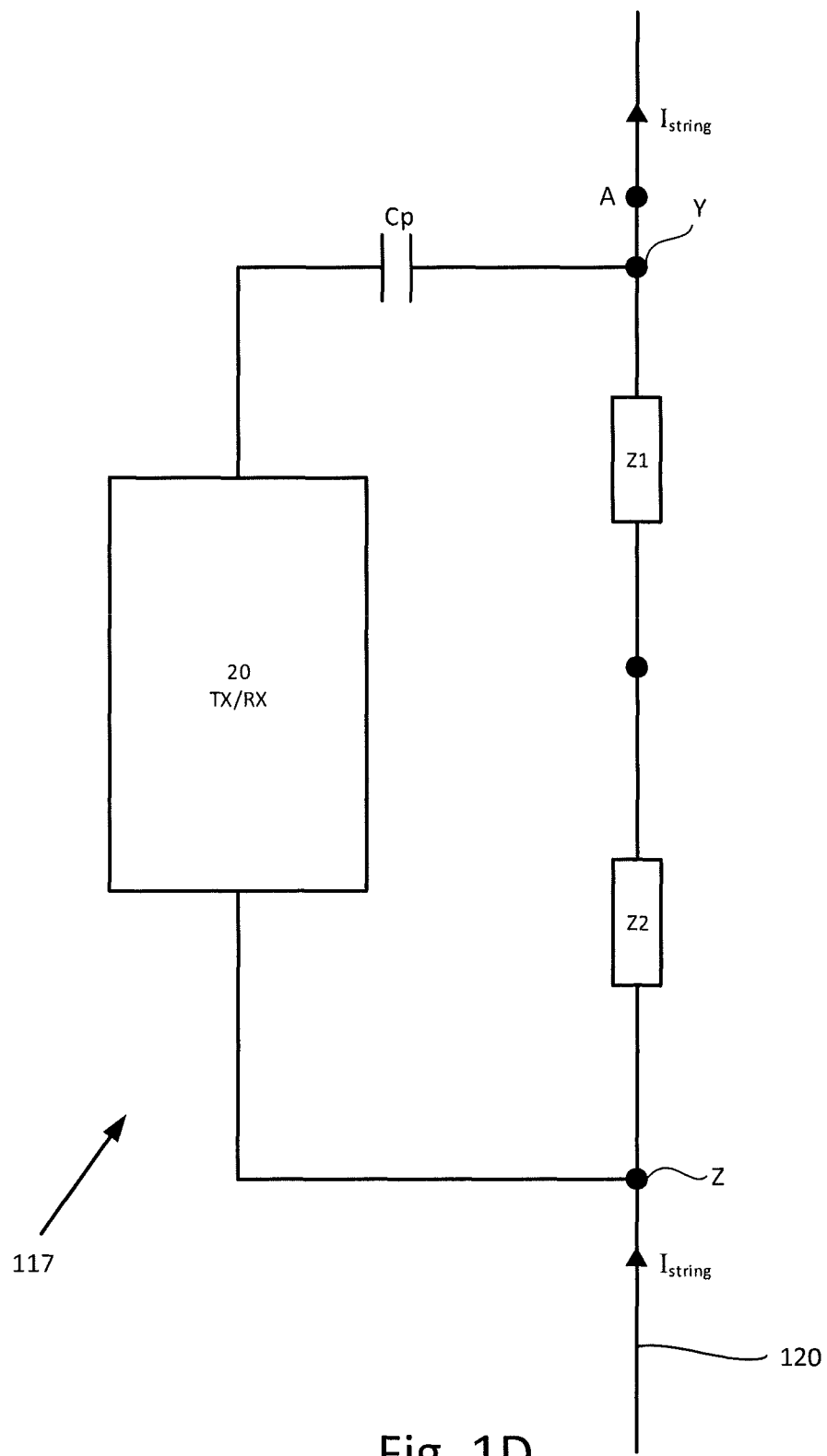
FIGS. 1D, 1E and 1F show details of communication devices that may be utilized for power line communications (PLC), according to illustrative aspects of the disclosure.
Figure 1E:
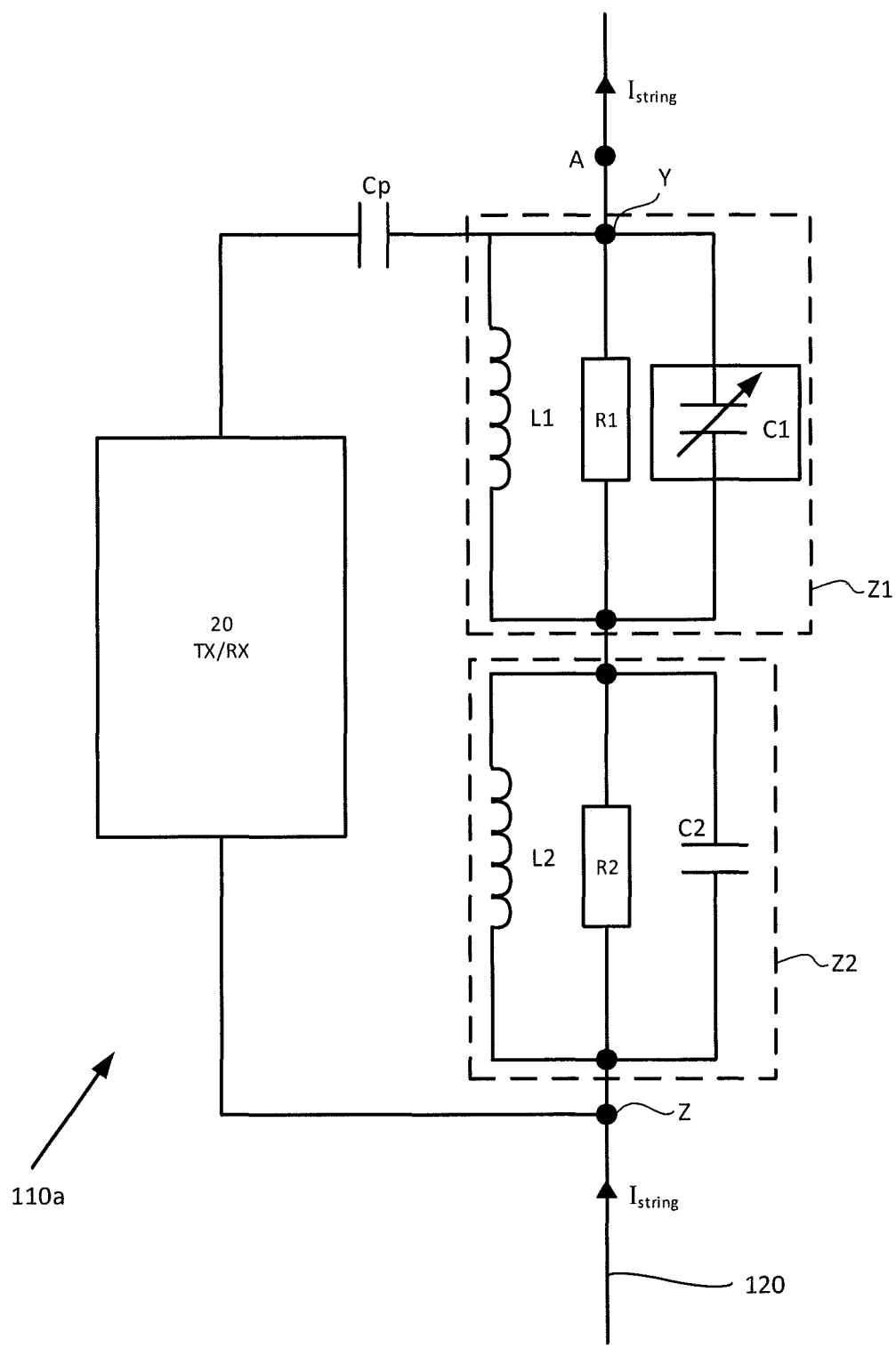

Reference is now made to FIG. 1D, which shows more details of communication device 117 that may be utilized for power line communications (PLC), according to illustrative aspects of the disclosure. A transceiver 20 may connect between terminals Y and Z between two power devices 103/103a via a coupling capacitor Cp. Terminals Z and Y may be included in power line 120 and/or be provided on the outputs of power device 103/103a to provide a series connection of power device 103/103a outputs. The series connection provides the flow of string current ($I_{string}$) between terminals A and B through power line 120. Terminal Y may connect to terminal A if communication device 110 is located and connected at power device 103a as shown in FIGS. 1A and 1E. In general, the total impedance ($Z_T$) across terminals Z and Y is the sum of an impedance Z1 of a first circuit and an impedance Z2 from a second circuit. Two impedance circuits Z1 and Z2 are shown as an illustrative example, additional aspects of the disclosure herein may feature more than two impedance circuits. One or more impedance circuits (e.g., Z1) may be active impedance circuits configured and operated to present an impedance of a certain value (e.g., 10 ohms) at a certain frequency (e.g., 100 kHz), and various impedance values as other frequencies. One or more impedance circuits (e.g., Z2) may be passive impedance circuits designed to provide impedance values at various frequencies without need for auxiliary operating power for adjusting impedance values.

Reference is now made to FIG. 1E, which shows details of communication device 110a that may be utilized for power line communications (PLC), according to illustrative aspects of the disclosure. With reference to FIG. 1A, the outputs of power devices 103/103a at terminals Y, Z may be connected together to form a serial string that connects between terminals A and B. One or more communication devices 110 may be coupled (e.g., directly connected) in a series connection in the serial string at any point in the serial string between terminals A and B. Communication device 110a of FIG. 1E may be used as communication device 110 of FIG. 1A and other figures which follow. The communication device 110a in FIG. 1E may connect between terminal A and terminal Y of power devices 103/103a. Communication device 110a may comprise a coupling circuit that includes a first circuit 21 of inductor L1, resistor R1 and capacitor C1 for impedance Z1. The first circuit 21 may be serially connected with a second circuit 22 of inductor L2, resistor R2 and capacitor C2, whereby the second circuit 22 is an element of the coupling circuit. Inductor L2, resistor R2 and capacitor C2 may be connected in parallel.

The second circuit 22 may, according to some aspects, just include one of inductor L2 and/or capacitor C2 for impedance Z2. A transceiver 20 may connect between terminals Z and Y between two power devices 103/103a via a coupling capacitor Cp. Capacitor C1 may be adjustable to provide a variable capacitance value responsive system conditions to enable increased transmission efficiency of a signal onto a power line 120. Transmission efficiency may be defined as the ratio of the power received by a communication device 110a over a transmission path (e.g., powerlines 120) to the power transmitted by another communication device 110. Capacitor C1 may be implemented as an active capacitor circuit, a bank of switched capacitors or by use of a tuning diode, also known as a varactor diode, variable capacitance diode, varicap diode or variable reactance diode. Tuning diodes may have a variable capacitance that is a function of the voltage that is impressed on their terminals.

Figure 1F:
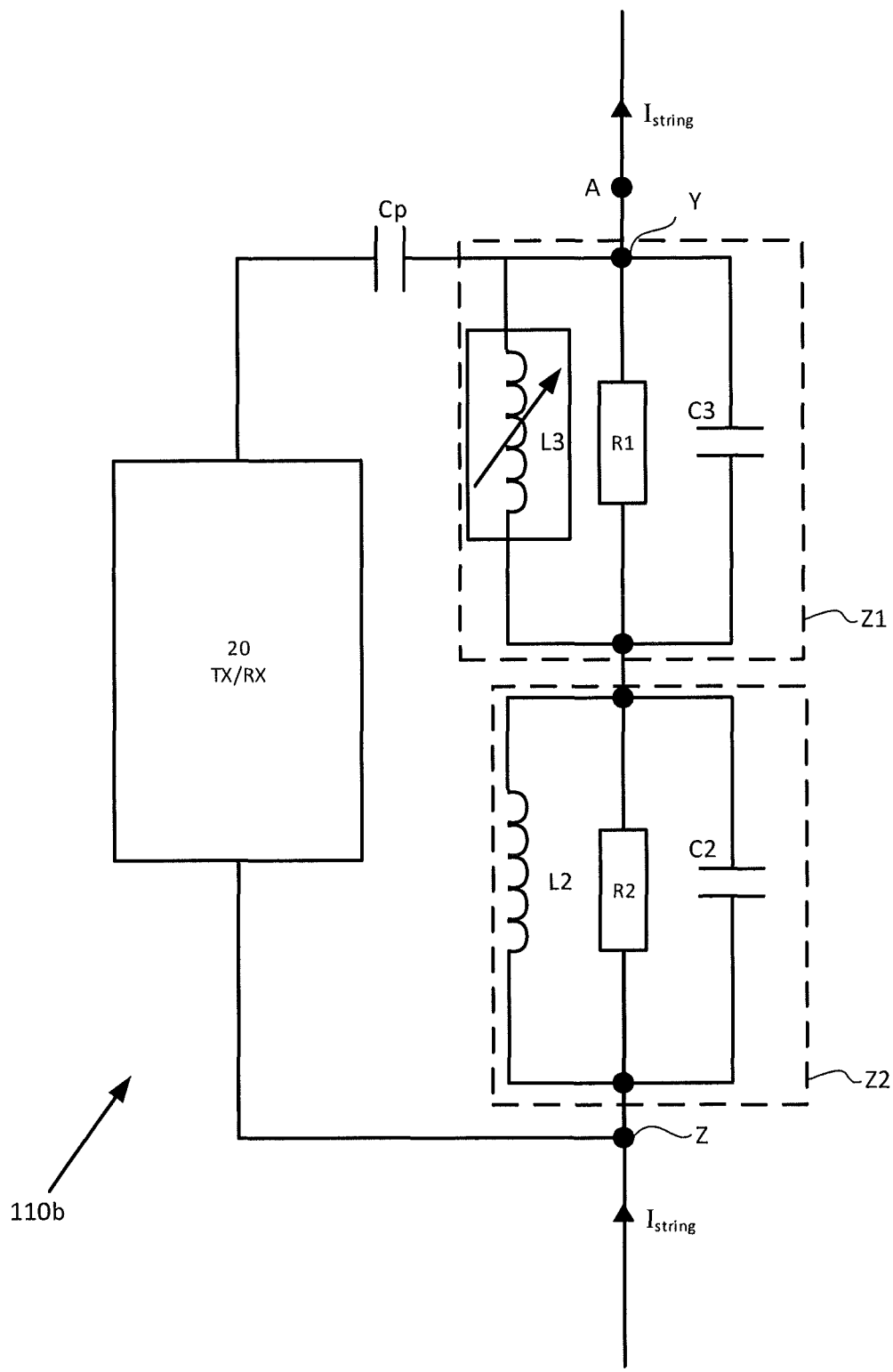

Reference is now made to FIG. 1F, which shows more details of communication device 110b that may be utilized for power line communications (PLC), according to illustrative aspects of the disclosure. Communication device 110b in FIG. 1D is the same as in FIG. 1C except that capacitor C3 may replace variable capacitor C1, and inductor L1 may be replaced by inductor L3. Inductor L3 may be an adjustable inductor to provide a variable inductance value to enable increased transmission efficiency of a signal onto power line 120 and/or increase reception efficiency from a signal present on powerline 120. Inductor L3 may be implemented as an active inductor circuit to provide a variable inductance value. Another implementation may be to use both variable inductor L3 and variable capacitor C1 in order to enable increased transmission efficiency of a signal onto power line 120.

Figure 1G:
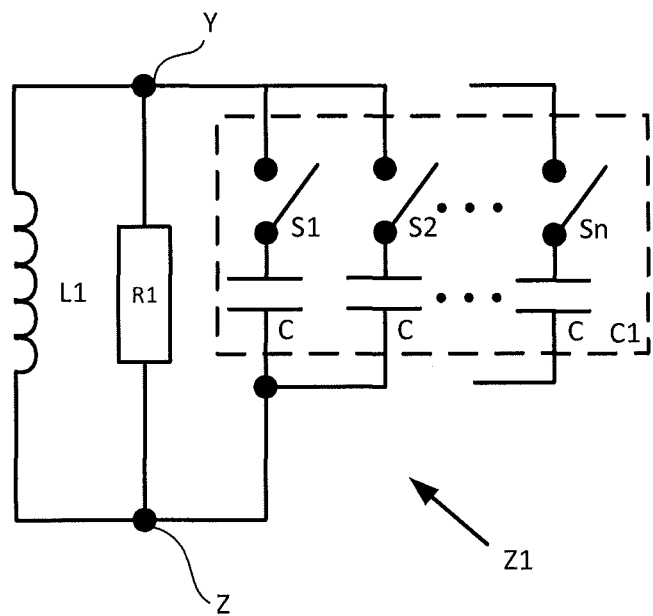
FIGS. 1G, 1H and 1I show details of variable impedance circuits according to illustrative aspects of the disclosure.
Figure 1H:
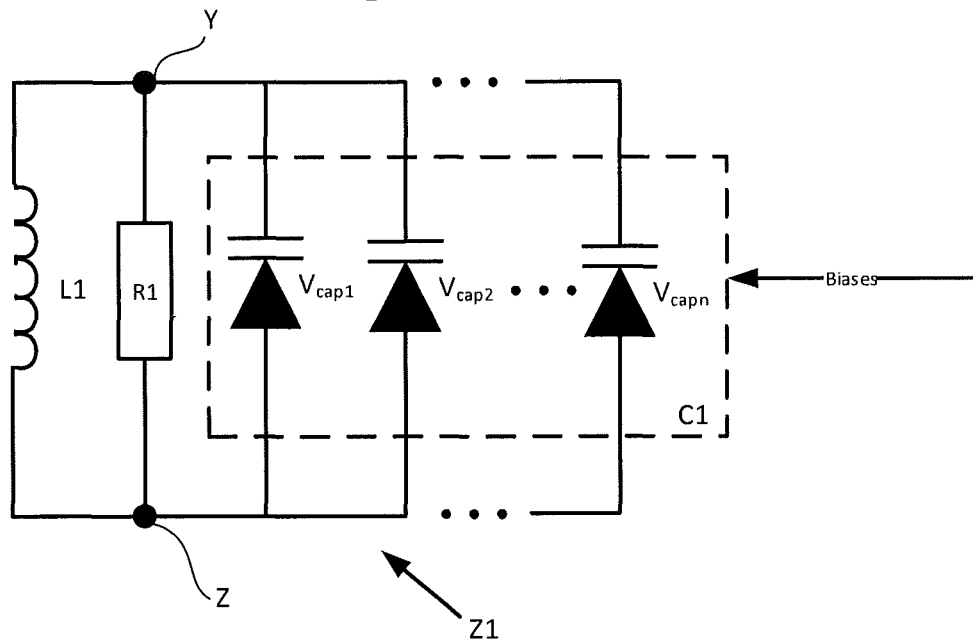
Figure 1I:
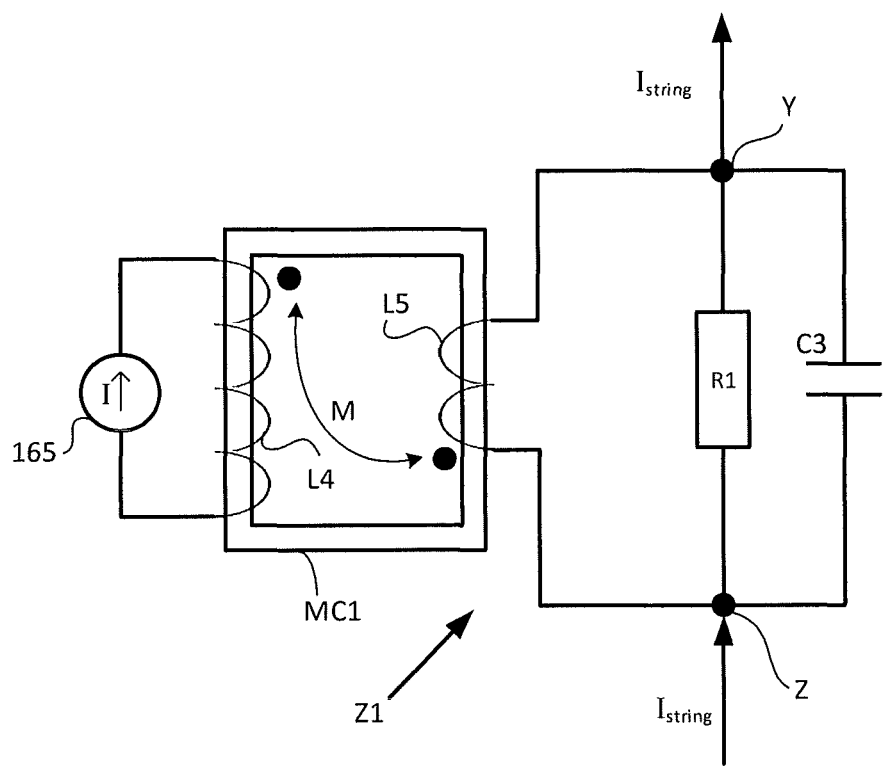

Reference is now made to FIGS. 1G, 1H and 1I, which show more details of impedance Z1, according to illustrative aspects of the disclosure. Impedance Z1 may be connected in series with impedance Z2 and as mentioned previously impedance Z2 may include inductor L2, inductor L2 and capacitor C2 in parallel. Operation of impedance Z1 may be responsive to electrical parameters of power systems 180/181 sensed by sensors 204a/sensor interfaces 125/204 for example. Operation of impedance Z1 may be responsive to further electrical parameters of sensed by sensors described above with respect to transceiver 20 to enable for example power line communications (PLC) or arc detection, for example. The power to operate and control impedance Z1 may be obtained from a power source connected to a device including impedance Z1 (e.g., with respect to FIG. 1A). A power source 101 may provide operational power for an impedance Z1 included in a corresponding power device 103/103a), from the power in a respective string of serially connect power devices 103a/103 or from other points in power systems 180/181 described above. The power to operate impedance Z1 may also be obtained from auxiliary power circuit 162 or other sources of auxiliary power such as batteries or from a utility grid for example. Sensing and control of impedance Z1 may be by controller 105 or other controllers, sensors mentioned above and in further in the descriptions which follow.

In FIG. 1G, variable capacitor C1 shown in FIG. 1E may be realized by a bank of switchable capacitors C. Each capacitor C may be selected to connect between terminals Y and Z by a number (n) of switches S1-Sn. Each capacitor C may have the same value or a range of different values which depending on the combination states of switches S1-Sn being either ON or OFF present a discrete range of values of capacitance. The discrete range of values of capacitance may applied and varied across terminals Y and Z. Switches S1-Sn may be implemented with solid state switches, such as metal oxide semi-conductor field effect transistors (MOSFETs), junction field effect transistors (JFETs), insulated gate bipolar transistors (IGBTs) or bipolar junction transistors (BJTs). Switches S1-Sn may be implemented with mechanical single pole switches or electro-mechanical relays.

As shown in FIG. 1H, variable capacitor C1 shown in FIG. 1E may be realized by a bank of 'n' varicap diodes $V_{cap1}$-$V_{capn}$ (also known as varactor diodes) that may exploit the voltage-dependent capacitance of their reversed-biased p-n junction. Therefore, biases applied to varicap diodes $V_{cap1}$-$V_{capn}$ may be used to select which varicap diode and its capacitance responsive to the bias is applied across terminals Y and Z and/or the level of string current $I_{string}$.

As shown in FIG. 1I, inductor L5 may be connected in parallel with resistor R1 and capacitor C3 across terminals Y and Z. Capacitor C3 may be a fixed value capacitor or may be implemented as a variable capacitor as shown with respect variable capacitor C1 shown in FIGS. 1G and 1H. Inductor L5 may be wound on a magnetic core MC1 along with inductor L4 that may also be wound on magnetic core MC1. Inductors L5 and L4 have a mutual inductance (M) where mutual inductance (M) occurs when, for example, the change in current in inductor L4 induces a voltage in nearby inductor L5 and vice versa; when, for example, the change in current (significant portion of $I_{string}$) in inductor L5 induces a voltage in nearby inductor L4. The relationship between inductors L4 and L5 may be expressed with the following standard equation:

$$M = N_4 N_5 P$$

where

M is the mutual inductance,

N4 is the number of turns in inductor L4,

N5 is the number of turns in inductor L5,

P is the permeance of the space occupied by the flux ($\Phi$) in magnetic core MC1.

A configurable (e.g., adaptable) current source 165 may connect across inductor L4. Therefore, a sensor 204a/sensor interface 204 of transceiver 20 and/or sensors/sensor interfaces 125 may sense the level of string current $I_{string}$ and inject a level of current from current source 165 through inductor L4. By way of a non-limiting example, the injection of the level and direction of current from current source 165 into inductor L4 may be responsive to the sensed level of string current $I_{string}$ beyond which inductor L5 becomes saturated, the level of current from current source 165 into inductor L4 may have the effect of altering the level of flux ($\Phi$) in magnetic core MC1 so that inductor L5 becomes less saturated. Therefore, the current injected from current source 165 may oppose the string current $I_{string}$ by virtue of the mutual inductance M between inductors L4 and L5. As part of a control algorithm to control inductor L5, a look up table of string current $I_{string}$ levels may provide the appropriate level of current and direction of current to be injected into inductor L4.

As a non-limiting, numerical example, inductor L5 may have a inductance of about 10 μH and may saturate at a string current of $I_{string}$=1 A. When it is sensed (e.g., by a sensor configured to measure $I_{string}$, the sensor not explicitly shown) that the string current $I_{string}$ is equal to 1.5 A, current source 165 may be operated to provide a current of about 0.5 A. Since inductor L4 is shown to have 4 windings, and inductor L5 is shown having 2 windings, the flux flowing through magnetic core MC1 is equivalent to that of a string current of $I_{string}$=0.5 A, and inductor L5 may maintain its inductance of about 10 μH and not become saturated.

According to aspects of the disclosure, an additional inductor (not explicitly shown, for clarity) may be disposed in series with inductor L4 and/or a capacitor (not explicitly shown, for clarity) may be disposed in parallel with inductor L4 to increase the impedance reflected towards inductor L5.

Figure 1J:
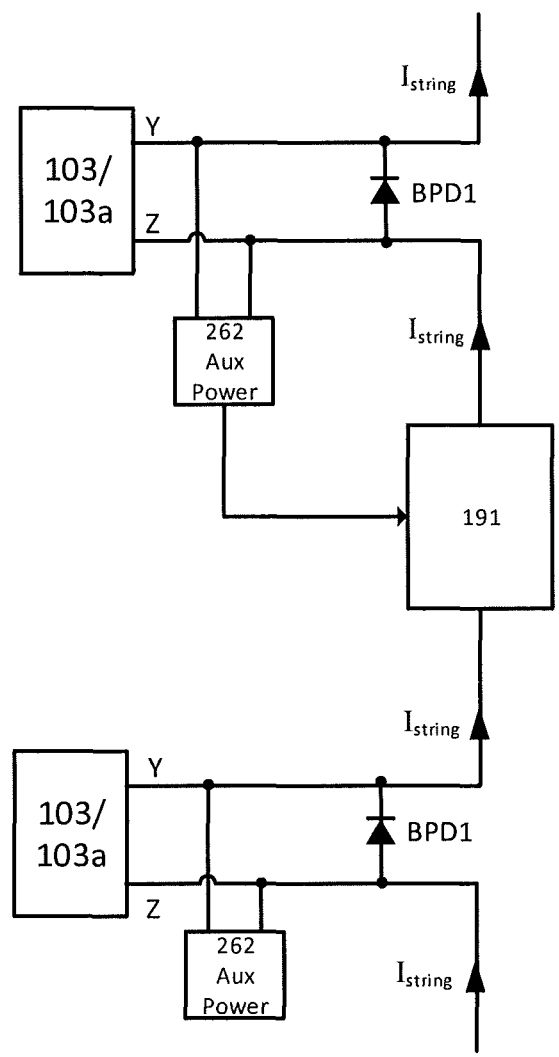
FIG. 1J shows a portion of a string of power devices incorporating a variable impedance device, according to illustrative aspects of the disclosure.

Reference is now made to FIG. 1J, which shows a diagram of how auxiliary power may be supplied to adjustable impedance circuits and/or communication devices described above, according to illustrative aspects of the disclosure. FIG. 1J shows a partial portion of a series string of power devices 103a/103 outputs. The supply auxiliary power to communication devices may be designed to receive power from power sources connected to other power devices and/or sources of power independent from power produced by power systems 180/181 as shown in FIGS. 1A and 1B. Auxiliary power circuit 262 may be connected to an output of a power device 103/103a, the output of power device 103/103a has a bypass diode BPD1 connected across terminals Y and Z of power device 103/103a. In series between terminal Z of one power device 103/103a and terminal Y of another power device 103/103a is a device 191. Device 191 may be, for example, a communication device 110/110a/110b/117 having an adjustable impedance circuit Z1 such as shown in FIGS. 1G, 1H, and 1I. In the event of a power device 103/103a ceasing to function, and/or a power source 101 (not shown) connected to the input of power device 103/103a not functioning or under-producing, a reverse bias may appear across terminals Y and Z and bypass diode BPD1 is forward biased. The forward bias of BPD1 and current $I_{string}$ passing through a power device 103/103a output may be used by auxiliary power circuit 262 to provide an operating power to an associated device 191. The operating power may be utilized and be sufficient to power the operation the first circuit of a device 191.

Still referring to FIG. 1J, according to aspects of the disclosure herein, an adjustable impedance circuit Z1 may be installed in a series string of power devices to increase or decrease the total impedance of the series string according to operational considerations. For example, when a transmitter in a different serial string is transmitting, it may be beneficial for impedance circuit Z1 (which may, in this case, feature only an inductor, or an inductor with an adjustable capacitor but without a resistor, or a full RLC circuit) to be operated to increase the string impedance, to prevent leakage of the signal into the serial string. As another example, device 191 may be an arc-detection circuit configured to measure voltage and/or current at a certain frequency, and based on the magnitudes of the measurements, determine whether an arc may be present in the system. The arc detection device may include an adjustable impedance circuit adjusted to achieve high impedance at a frequency that is reasonably "clean", i.e., a frequency not used for other purposes and not "noisy" due to external system factors. The adjustable impedance may be adjusted to provide high impedance for improved measurement and improved arc detection at the selected frequency.

In general, in the descriptions which follow, communication devices using wiring configurations similar to wiring configuration 111 of FIG. 1A may be required to operate under a wide range of system conditions. For example, when a large direct current (DC) current flows through communication device 110 (e.g., when power sources 101 of FIG. 1A are irradiated by substantial sunlight and are producing substantial power), an inductor with a low saturation current may become saturated and cease to operate as an effective impedance for communications. When power sources 101 are under producing current (e.g., due to shading, or at dusk or dawn), an inductor having low inductance might not sustain current in a satisfactory manner. Using a single inductor having both high saturation current and high inductance may be expensive.

Designing communication devices 110 and/or 110a to have a first circuit and a serially-connected second circuit may enable component selection to provide high performance under various operating conditions. For example, the second circuit may include inductor L2 that may be a high-inductance inductor (e.g., having an inductance of 5 µH, 10 µH, 20 µH, etc.), but might have low saturation current. The first circuit may serve as a variable impedance adjustable to present an equivalent impedance according to system parameters (e.g., line inductance and impedance), and the inductor L1 of the first circuit may have a high saturation current to prevent saturation when substantial current flows through the communication device. The first circuit impedance may be adjusted by changing the capacitance of capacitor C1. A further consideration of the first circuit is that inductor L1 may be implemented as per FIG. 1I with mutual inductors L4 and L5 so that the level of current from current source 165 into inductor L4 may have the effect of altering the level of flux (Φ) in magnetic core MC1 so that inductor L5 that may have the same inductance as inductor L1 becomes less saturated. In sum, the first circuit may provide the features of a variable impedance (Z) and bandwidth (BW) along with the feature to extended the level to which an equivalent inductor of the first circuit is saturated responsive to the level of string current $I_{string}$.

In general, for both the first and the second circuits, the impedance (Z) may be given by:

$$Z = \frac{1}{\left(\left(\frac{1}{R}\right)^2 + \left(\frac{1}{X_L} - \frac{1}{X_c}\right)^2\right)^{\frac{1}{2}}} \qquad \text{Eq. 1}$$

Where R is resistance, $X_L$ is inductive reactance and $X_C$ is capacitive reactance.

$$X_L = 2\pi f L \qquad \text{Eq. 2}$$

$$X_c = \frac{1}{2\pi f C} \qquad \text{Eq. 3}$$

Where f is frequency, L is inductance and C is capacitance.

The parallel resonance occurs when $X_L = X_C$, the resonant frequency $f_r$ is:

$$f_r = \frac{1}{2\pi\sqrt{LC}} \qquad \text{Eq. 4}$$

The quality (Q) factor is:

$$Q = R\sqrt{\frac{C}{L}} \qquad \text{Eq. 5}$$

The bandwidth (BW):

$$BW = \frac{f_r}{Q} \qquad \text{Eq. 6}$$

Higher frequency limit ($f_h$) and lower frequency ($f_l$) of the bandwidth (BW) are:

$$f_h = f_r + \frac{BW}{2} \qquad \text{Eq. 7}$$

-continued $$f_l = f_r - \frac{BW}{2} \qquad \text{Eq. 8}$$

Or the Q factor may be given by:

$$Q = \frac{f_r}{BW} \qquad \text{Eq. 9}$$

Figure 2:
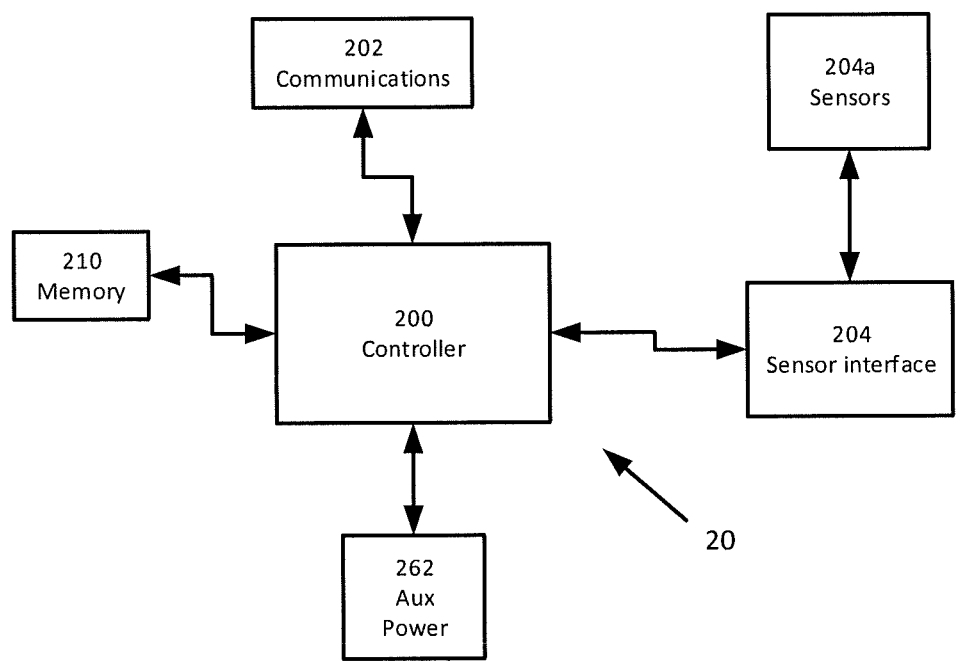
FIG. 2 shows a block diagram of further details of a transceiver, according to illustrative aspects of the disclosure.
Figure 3A:
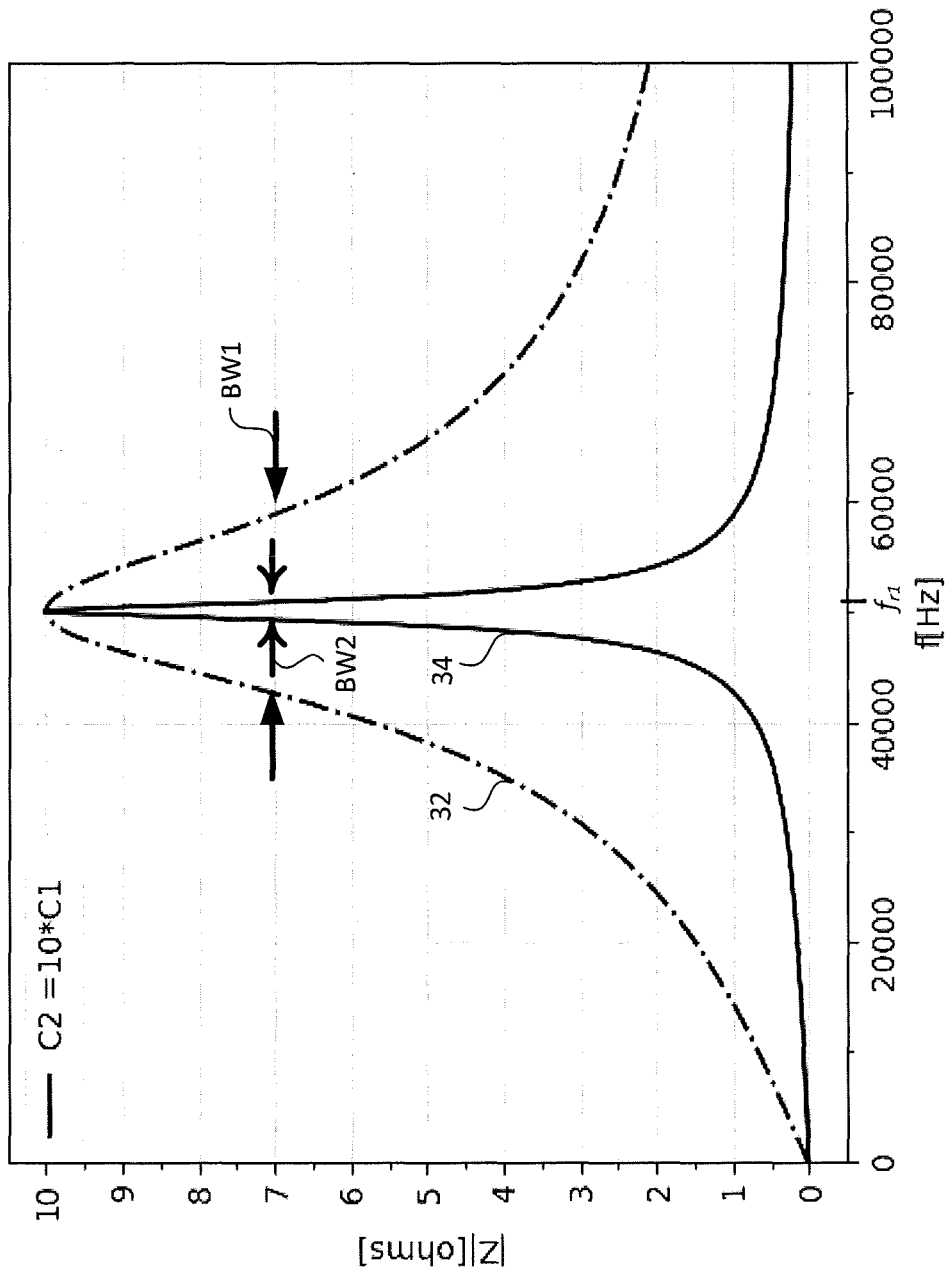
FIGS. 3A, 3B and 3C show representative frequency response curves of a first circuit and a second circuit, according to illustrative aspects of the disclosure.

Reference is now made to FIG. 2, which shows a block diagram of the details of a transceiver 20, according to illustrative aspects of the disclosure. Controller 200 may include a microprocessor, microcontroller and/or digital signal processor (DSP) that may be connected to memory device 210. Memory device 210 may be similar to or the same as memory device 123 of FIG. 1C. With respect to FIG. 1A, controller 200 in one communication device 110 may serve as a central controller to the other controllers 200 of the other communication devices 110. Therefore, communications interface 202 connected to controller 200 may provide communications between controllers 200 and other controllers 200/105 included in power system 180, for example. The communications to and from communications interfaces 202 of communication devices 110 may be by power line communication (PLC) over power lines 120 according to the circuit features described below with respect to communication device 110. Communications in communications interface 202 may also include measured or sensed communication parameters via sensors 204a/sensor interface 204. Communications interfaces 202 may communicate with a local area network or cellular network in order to establish an internet connection that, for example, may provide a feature of remote control, remote monitoring and/or reconfiguration of power devices 103/103a and/or system power device 107, for example. Transceiver 20 may further include auxiliary power circuit 262, configured to receive power from a power source connected to power device 103/103a, system power device 107 and output power suitable for operating other circuitry components (e.g., controller 200, communication interface 202, etc.). According to some aspects of the disclosure, auxiliary power circuit 262 may be connected to an output of a power device 103/103a, system power device 107 and designed to receive power from power sources connected to other power devices and/or sources of power independent from power produced by power system 180. Reference is now made to FIG. 3A, which shows illustrative impedance curves of the first impedance circuit first impedance circuit of inductor L1, resistor R1 and adjustable capacitor C1 and the second impedance circuit of inductor L2, resistor R2 and capacitor C2 of FIG. 1C according to illustrative aspects of the disclosure. The vertical axis indicates impedance (|Z|), and the horizontal axis indicates frequency (f). Similar shaped curves may be drawn with respect to the modulus of the gain (|gain|) and/or Q factor. Impedance curve 32 is the frequency-impedance curve for the second circuit where R2=10Ω, L2=10 μH, C2=1 μF, and the resonant frequency ($f_r$) of the second impedance circuit is about 50.3 kHz, with a Q-factor of about 3.16 and a bandwidth BW1 of about 15.9 kHz. Impedance curve 34 is the frequency-impedance curve for the first circuit where R1=10Ω, $$L1 = \frac{1}{10} \cdot L2 = 1 \; \mu H,$$

C1=10·C2=10 μF. Response curve 34 also has a resonant frequency ($f_r$) of about 50.3 kHz, with a Q-factor of about 31.62 and a bandwidth BW2 of about 1.59 kHz.

The second impedance circuit Z2 may include inductor L2 that may provide an inductance of 10 μH at low current (e.g., when the current flowing through impedance circuit Z2 is less than a saturation current of 1 A) but may saturate at higher currents (e.g., above 1 A), and therefore, impedance curve 32 may accurately depict the impedance of second impedance circuit Z2 only under low current. At higher currents, the second impedance circuit Z2 may provide an impedance close to 0Ω, due to inductor L2 saturating and "shorting" the impedance circuit.

Where an impedance of about 10Ω, is desired at the resonant frequency, the second impedance circuit Z2 may provide the desired impedance at low current levels. At higher current levels, where the second impedance circuit Z2 may be nullified, the first impedance circuit Z1 may provide the desired impedance by an impedance controller adjusting capacitor C1 to have a capacitance of about 10 μF. By including a first inductor L1 having a high saturation current (though a low inductance value), and a second inductor L2 having a high inductance value (though a low saturation current threshold), at certain frequencies, the combination of impedances Z1 and Z2 may perform substantially the same as a passive impedance featuring an inductor having both high inductance and a high saturation current, and at a fraction of the cost of the passive impedance circuit.

Adjusting one or more component values of a variable impedance circuit may provide further advantage. For example, by implementing a high-Q, low-bandwidth impedance (e.g., second impedance circuit Z2) with a resonant frequency that is adjustable by adjusting the value of a capacitor, high impedance can be selectively obtained at various frequencies. Changing the resonant frequency of an impedance circuit may be useful, for example, for operating an impedance circuit in multiple modes of operation. For example, where an impedance circuit is used as part of a PLC device, it may be desirable for the impedance circuit to provide a first resonant frequency value while in a first mode of operation (e.g., Rx, or a receiving mode) and to provide a second resonant frequency value while in a second mode of operation (e.g., Tx, or a transmitting mode).

Figure 3B:
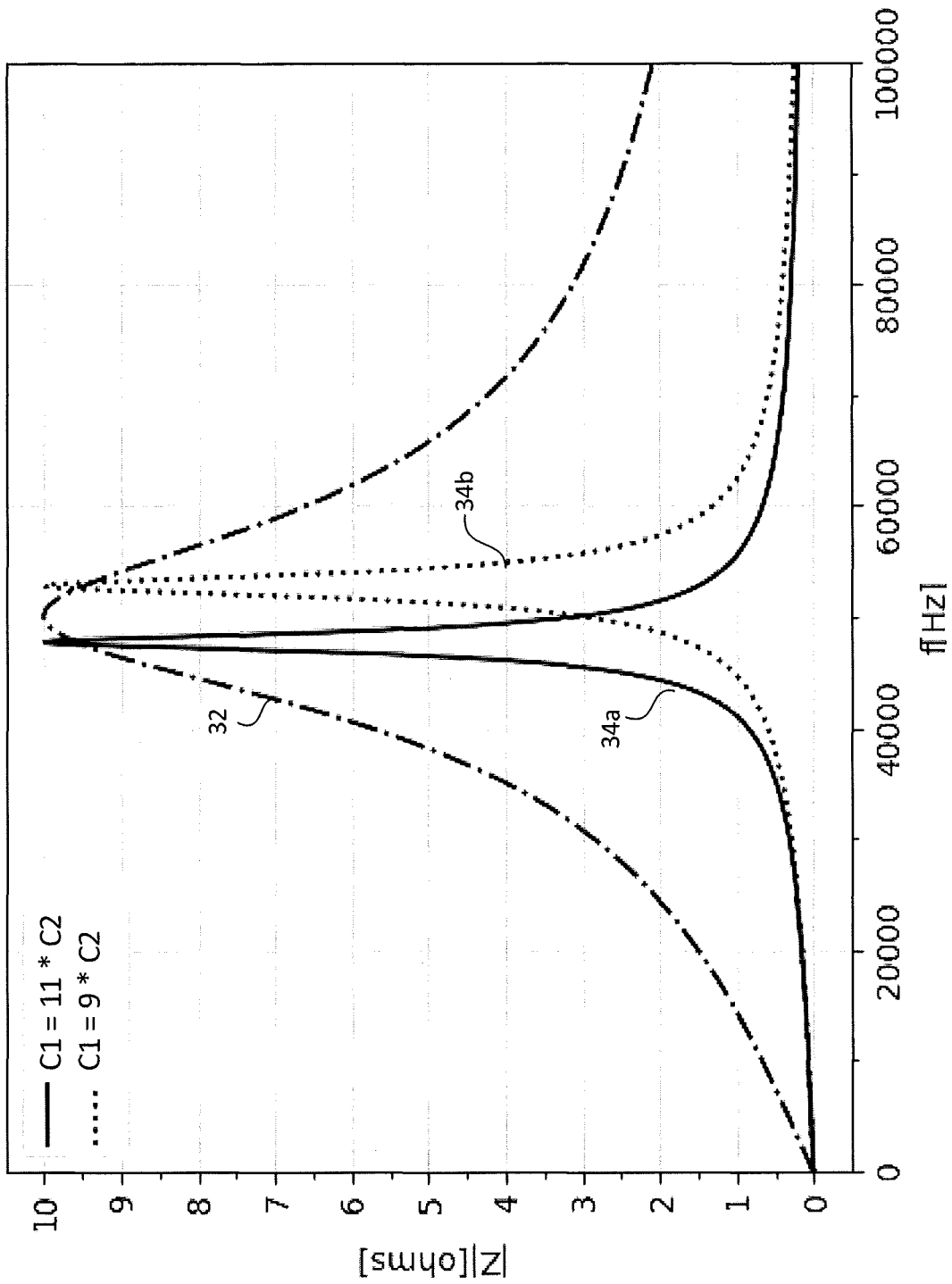
Figure 3C:
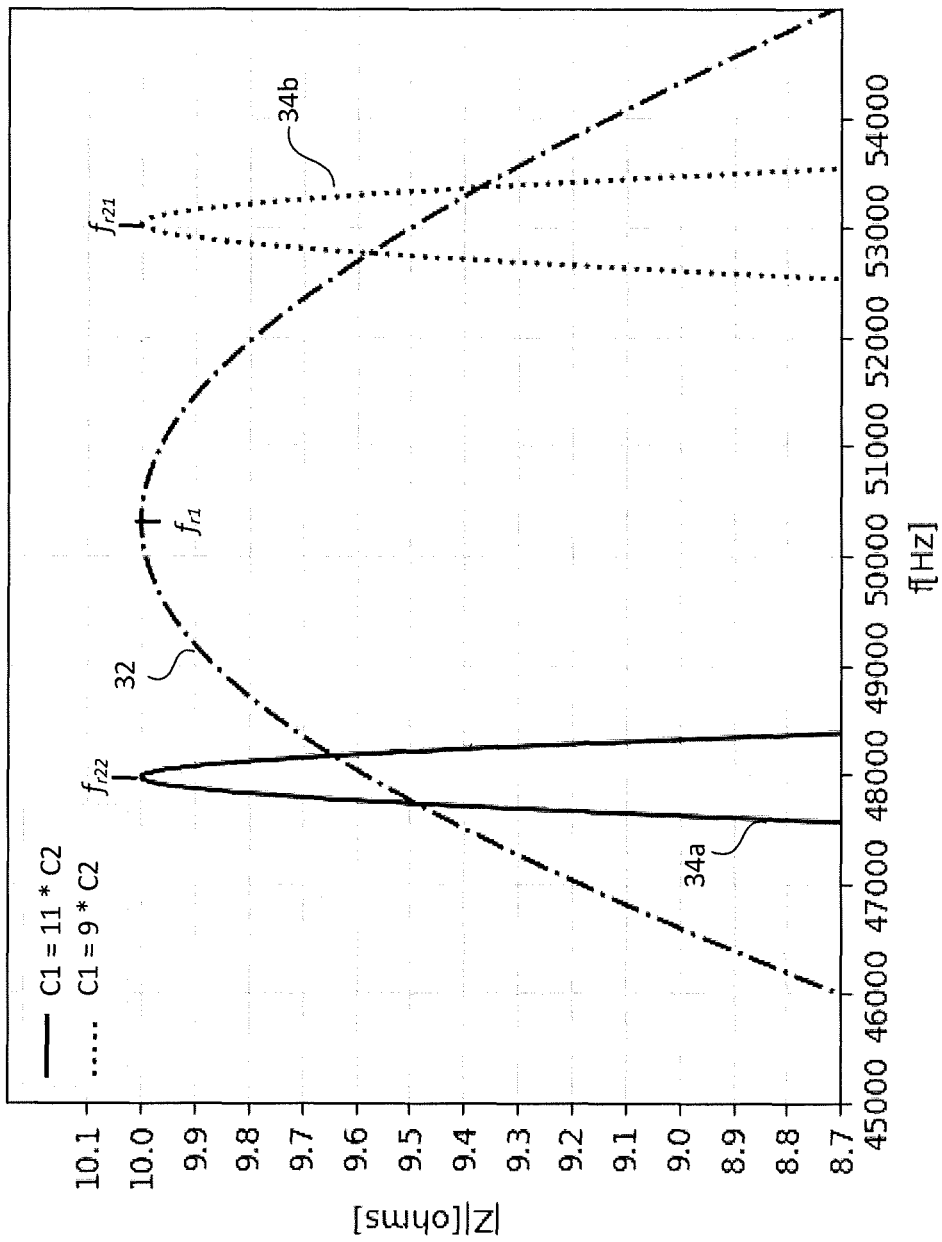

Reference is now made to FIGS. 3B and 3C, which show illustrative impedance curves 30 of the first impedance circuit of inductor L1, resistor R1 and adjustable capacitor C1 and the second impedance circuit of inductor L2, resistor R2 and capacitor C2 of FIG. 1C, according to illustrative aspects of the disclosure. FIG. 3C shows a "zoomed-in" view of a portion of FIG. 3B. The vertical axis is the impedance (|Z|) versus frequency (f) on the horizontal axis. Similar shaped curves may be drawn with respect to the modulus of the gain (|gain|) and/or Q factor. Impedance curve 32 is the impedance curve for the second circuit where R2=10Ω, L2=10 μH, C2=1 μF, and the resonant frequency ($f_{r2}$) of the second impedance circuit is about 50.3 kHz. Response curves 34a and 34b are the frequency curve for the first circuit where R2=10Ω, L2=1 μH, and the resonant frequency ($f_{r1}$) and bandwidth BW1 may be adjustable by virtue of capacitor C1 (and/or inductor L3 of FIG. 1D) being adjustable. Response curve 34a is obtained when capacitor C1 is adjusted to have a value of C1=11 μF, and response curve 34b is obtained when C1 is adjusted to have a value of C1=9 μF. Response curve 32 may have a low Q factor (about 3.16) and wider bandwidth BW2 (about 15.9 kHz) compared to response curves 34a and 34b which may have higher Q factors (about 33.2 and 33.0, respectively) and narrower bandwidths (about 1.45 kHz and about 1.77 kHz, respectively) compared to impedance curve 32 since with respect to Table 1 (shown below) capacitor C1 has about ten times more capacitance (e.g., nine times more or eleven times more capacitance) than capacitor C2 and/or inductor L3 (of FIG. 1D) has ten times less inductance than inductor L2.

Capacitor C1 may be adjusted such that first impedance circuit Z1 selectively provides a high impedance (in this numerical example, 10Ω) at different frequencies. When operational power is not available for adjustment of capacitor C1 (e.g., when a power source connected to impedance circuits Z1 and Z2 is not producing substantial power, indicating a low-current flow through impedance circuits Z1 and Z2), impedance circuit Z1 may be unsaturated and may provide a high impedance across a reasonably broad bandwidth (in this example, about 15.9 kHz).

Referring now to FIG. 3C, impedance curve 34a (where C1=11 μF) may have a resonant frequency of about 48 kHz, and impedance curve 34b (where C1=9 μF) may have a resonant frequency of about 53 kHz. Both impedance curves can be seen to have a rapid rolloff (i.e., a low bandwidth). Capacitor C1 may be adjusted to be 9 μF when a PLC device is in a first (e.g., transmitting) mode, and capacitor C1 may be adjusted to be 11 μF when a PLC device is in a second (e.g., receiving) mode.

As mentioned above, aspects of the disclosure include having more than one adjustable impedance circuits connected in series. For example, an impedance curve equal to the combination of impedance curves 34a and 34b may be obtained by operating two impedance circuits similar to Z1, one having a capacitor value of $C1_1$=9 μF and one having a capacitor value of $C1_2$=11 μF. This may be useful, for example, for operating a PLC circuit to transmit/receive a first signal at a first frequency and concurrently transmit/receive a second signal at a second frequency.

Figure 4A:
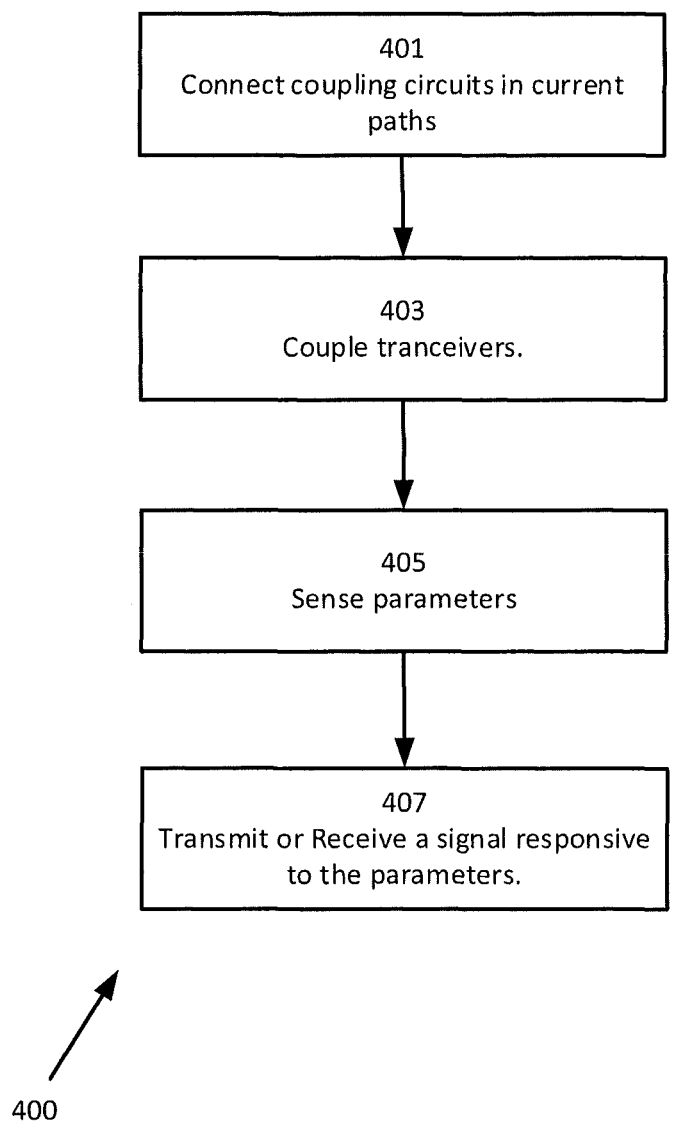
FIG. 4A shows a flow chart of a method, according to illustrative aspects of the disclosure.

Reference is now made FIG. 4A, which shows a flow chart of a method 400, according to illustrative aspects of the disclosure. By way of a non-limiting example, descriptions that follow provide further details of power line communications carried out by communication devices 110 of power systems 180/181 as shown in FIGS. 1A and 1B. Power systems 180/181 includes multiple strings of wiring configurations 111/115 that are connected in parallel at terminals A and B. Wiring configurations 111/115 may include power converter 103/103a whose outputs are connected in series to form the multiple strings of wiring configurations 111/115 connected in parallel at terminals A and B and whose inputs are connected to power sources 101. Power converters 103/103a may be DC to DC converters and power sources 101 may be photovoltaic panels, for example. Wiring configurations 111/115 and their interconnections, monitoring and control are designed to achieve an efficient power delivery to load 109. Therefore, the efficient power delivery may be by reliable communication signals conveying control signals and monitoring signals between components of power systems 180/181.

According to features described below, reliable communications may be carried out between components of power systems 180/181 and may enable proper efficient operation of power system 180. Therefore, efficient transmission and reception of communication signals by power line communications may consider the control of adjustments of communication parameters of the communication coupling circuits of communication devices 110, as well as the passive communication parameters of the communication coupling circuits of communication devices 110. Consequently, the use of passive communication parameters and/or adjustments of communication parameters may convey communication signals responsively to the operating power parameters of power system 180. Operating power parameters of power system 180 may include MPPT circuitry to extract increased power from a power source 101 and/or levels of $V_{AB}$ or string currents $I_{string\ 1}$, $I_{string\ 2}$ to be applied efficiently to load 109 via system power device 107 that also may include MPPT circuitry.

At step 401, communication device 110 may connect in a series connection in the serial string at any point in the serial string between terminals A and B as shown in FIG. 1A. The series connection in FIG. 1B may connect between terminal A and terminal Y of power devices 103/103a. The series connection may include a first circuit of inductor L1, resistor R1 and capacitor C1. The first circuit may be serially connected with a second circuit of inductor L2, resistor R2 and capacitor C2. The first and the second circuit may include respective resistors R1 and R2. The second circuit may include inductor L2 and/or capacitor C2.

For purposes of an illustrative example, reference will be made to power system 180 of FIG. 1A. Method 300 may be similarly applicable to power system 181 of FIG. 1B. During operation of power system 180, DC power to the input of power device 107 may be via string currents $I_{string\ 1}$ and $I_{string\ 2}$, conveyed by power lines 120. Therefore, DC power to the input of power device 107 is not impeded by the first and the second circuits since the flow of string currents $I_{string\ 1}$, $I_{string\ 2}$ is through inductors L1 and L2. However, the flow of string currents $I_{string\ 1}$, $I_{string\ 2}$ through inductors L1 and L2 may affect power line communications and so the selection of values for the inductors, capacitors and resistors for the first and the second circuits are discussed below by way of a non-limiting example.

During suboptimal operating conditions, the flow of string currents $I_{string\ 1}$, $I_{string}$ may be reduced. Reduced flow of string currents $I_{string\ 1}$, $I_{string\ 2}$ may be because power sources 101 are occasionally shaded by shade 112, there is a faulty power device 103/103a that needs to be bypassed by bypass unit Q9, and/or when power system 180 is operating at dawn or dusk, for example.

In general, a summary of how the impedance (Z) of a parallel connected resistor (R) inductor (L) capacitor (C) circuit is shown below in Table 1 where Z is derived from equation Eq. 1:

TABLE 1

| $f_r \pm$ | −3 KHz Z = | −2 KHz Z = | −1 KHz Z = | 0 KHz Z = | +1 KHz Z = | +2 KHz Z = | +3 KHz Z = |
|---|---|---|---|---|---|---|---|
| L = 10 μH, C = 1 μF R = 10Ω $f_r$ = 50.3 KHz Q = 3.16 | 9.18Ω | 9.58Ω | 9.86Ω | 9.99Ω | 8.97Ω | 9.79Ω | 9.5Ω |

TABLE 1-continued

| $f_r\pm$ | −3 KHz Z = | −2 KHz Z = | −1 KHz Z = | 0 KHz Z = | +1 KHz Z = | +2 KHz Z = | +3 KHz Z = |
|---|---|---|---|---|---|---|---|
| BW = 15.9 KHz | | | | | | | |
| L ÷ 10 = 1 µH, C × 10 = 10 µF $f_r$ = 50.3 KHz Q = 31.62 BW = 1.6 KHz | 2.24Ω | 3.16Ω | 5.09Ω | 9.2Ω | 7.67Ω | 4.35Ω | 2.92Ω |

In Table 1, a resonant frequency ($f_r$) of 50.3 KiloHertz (KHz) is chosen for power line communications and nearest preferred values for inductor (L) and capacitor (C) in the first row of Table 1 that shows how the impedance (Z) varies for frequencies ± of the resonant frequency ($f_r$). Quality factor of 2.35 and bandwidth (BW) of 26 KHz are derived from respective equations Eq. 5 and Eq. 6. Narrow band power line communication PLC may operate from 3 KHz to about 500 KHz. In Europe, the European Committee for Electrotechnical Standardization (CENELECT) reserves some frequencies so that Band A is between 3-95 KHz for Utilities/smart grids, Band B is between 95-125 KHz and is unrestricted, Band C is between 125-140 KHz for home networks and Band D is between 140-148.5 KHz for alarms and security systems.

The second row of Table 1 shows how the impedance (Z) varies for frequencies ± of the resonant frequency ($f_r$) for L÷0 and C×10 so that both possibilities for the selection of inductor (L) and capacitor (C) shown in the two rows have the same resonant frequency ($f_r$) of 61.03 KHz. Quality factor (Q) of 23.5 and bandwidth (BW) of 26 KHz are derived from respective equations Eq. 5 and Eq. 6.

Inductors L1 and L2 may be formed/wound on ferrite cores or toroidal cores. The first circuit of inductor L1, resistor R1 and capacitor C1, may have an inductor for L1 that corresponds with the second row of Table 1 so that there is a lower inductance value, and higher Q value, but the ferrite core that inductor L1 is wound on has a higher saturation current compared to the choice of inductor L2. Inductor L2 used in the second circuit that corresponds with the first row of Table 1 has a higher inductance value, and lower Q value, but the ferrite core that inductor L2 is wound on has a lower saturation current compared to the choice of inductor L1. Typically, power line communications under 'higher' normal levels of string currents $I_{string\ 1}$, $I_{string\ 2}$ may use the first circuit of inductor L1, resistor R1 and an adjustable capacitor C1 when operating power for transceiver 20 is derived from power generated by power system 180. Power line communications under 'lower' levels of string currents $I_{string\ 1}$, $I_{string\ 2}$, when a power source 101 is shaded, for example, or it is dusk or dawn, may derive benefits from circuit performance of the second circuit of inductor L2, resistor R2 and capacitor C2 when operating power for transceiver 20 may be derived from an auxiliary power such as power from auxiliary power circuits 162/262, the auxiliary power being independent of power generated by power system 180.

At step 403, transceiver 20 may connect between terminals Z and Y between two power devices 103/103a via a coupling capacitor Cp. A variety of modulation schemes can be used for power line communications. Some modulation schemes may include Orthogonal Frequency Division Multiplexing (OFDM), Binary Phase Shift Keying (BPSK), Frequency Shift Keying (FSK), or Spread-FSK (S-FSK). OFDM in particular may offer high data rates, but may require more computational power to produce Fast Fourier Transforms (FFT) and Inverse-FFT (IFFT), as required by the scheme. On the other hand, BPSK, FSK are robust and simple but offer lower data rates. As with other communications schemes, power line communication for power systems like power system 180 may utilize simplex, half duplex, and/or full duplex. In the case of simplex communication power lines 120, a channel is formed that may be operated in one direction at a time, whereas in half duplex each communication devices 110 can communicate with the other but not simultaneously unlike full duplex.

At step 405, communication parameters of each communication devices 110 may be sensed by sensors 204a to provide the resonances of the first and second circuits, the Q factor of the resonances, the bandwidth (BW) of the first and second circuits, the resistances of the first and second resistors or the impedances of the first and second circuits. The total impedance ($Z_T$) between terminals A and Y of a communication device 110 is the sum of the impedances of the first and second circuits:

$$Z_T = \frac{1}{\left(\left(\frac{1}{R1}\right)^2 + \left(\frac{1}{X_{L1}} - \frac{1}{X_{c1}}\right)^2\right)^{\frac{1}{2}}} + \frac{1}{\left(\left(\frac{1}{R2}\right)^2 + \left(\frac{1}{X_{L2}} - \frac{1}{X_{c2}}\right)^2\right)^{\frac{1}{2}}} \quad \text{Eq. 10}$$

Where the second circuit is inductor L2, the sum of the impedances of the first and second circuits are given by:

$$Z_T = \frac{1}{\left(\left(\frac{1}{R1}\right)^2 + \left(\frac{1}{X_{L1}} - \frac{1}{X_{c1}}\right)^2\right)^{\frac{1}{2}}} + X_{L2} \quad \text{Eq. 11}$$

Sensing at step 405 may also include transmission of a test pulse and the communication parameters sensed may include a measure of the voltage standing wave ratio (VSWR) of the test pulse. Therefore, alteration of the first parallel circuit and/or adjustment of an additional matching network (not shown) connected at terminals A and Y may be made to try ensure an improved signal transmission of a transmitted signal from transceiver 20.

Step 405 may also allow sensors 204a to sense an operating power parameter such as string currents $I_{string\ 1}$, $I_{string\ 2}$ or voltages in a string or the voltage $V_{AB}$ and/or current at terminals A and B for example.

Step 405 may also include the operating power parameters to be sensed by sensors/sensor interfaces 125 of power devices 103/103a and/or system power devices 107. Sensors 204a may also be configured to measure operating power parameters directly or receive measured operating power parameters from other connected sensors and/or sensor interfaces 125/204a that may be a part of power devices 103/103a and/or system power devices 107. Therefore, operating power parameters may be sensed and/or measured on or near the inputs and outputs of power sources 101, power devices 103/103a and/or system power devices 107. Operating power parameters may be sensed and/or measured such as the voltage and/or current output by power source 101 and/or the power output by power source 101 for example. Where power source 101 may be a photovoltaic (PV) generator comprising PV cells, sensor or sensor interface 125/204a may directly measure or receive measurements of the irradiance received by the PV cells, and/or the temperature on or near the PV generator, for example.

With respect to communication signals being received and transmitted in power system 180, a spectrum of signals may be used for power line communication within a certain bandwidth ($BW_{signals}$) that may be centered around the center frequency ($f_c$). The center frequency ($f_c$) may be the same as the resonant frequency ($f_{r2}$) of the second circuit and/or may be the same as the resonant frequency ($f_{r1}$) of the first circuit. By way of a non-limiting example, the resonant frequency ($f_{r1}$) of the first circuit may be selected by adaptive control and/or by robust control by virtue of capacitor C1 and/or inductor L1 being adjustable, sensing and control as part of step 405 may ensure that a transmission of a signal from a transceiver 20 is to be received by other transceivers 20 using a high Q as shown by impedance curve 34. The high Q may allow for a higher signal to noise ratio in the channels provided by power lines 120 to enable efficient power line communications between communication devices 110.

However, where there is insufficient operating power to one or more transceivers 20 (and by way of a non-limiting example, where only a first circuit is connected between terminals A and Y) a scenario may exist where a transmission by a transceiver 20 may be absorbed and attenuated by another receiving transceiver 20 where its first circuit is outside bandwidth BW1 of impedance curve 34. Being outside of bandwidth BW1 of impedance curve 34 may be by virtue of insufficient power to provide adjustable control of its first circuit responsive to sensing at step 405. Therefore, with reference to the second row of Table 1, the impedance ($Z_T$) of the receiving transceiver 20 is lower when outside bandwidth BW1 of impedance curve 34 compared to the impedance ($Z_T$) at resonance $f_{r2}$ for a second parallel circuit. From a signal perspective, transmission by a transceiver 20 may be absorbed and attenuated by another receiving transceiver 20 operating outside bandwidth BW1 of impedance curve 34. A feature and benefit of including the second circuit in series with the first circuit may be to ensure reception of transmitted signals because of the wider bandwidth BW2 provided by the second circuit and/or with reference to equations Eq. 10 and Eq. 11, a higher impedance ($Z_T$) may be provided that may prevent absorption and attenuation by another receiving transceiver 20.

Figure 4B:
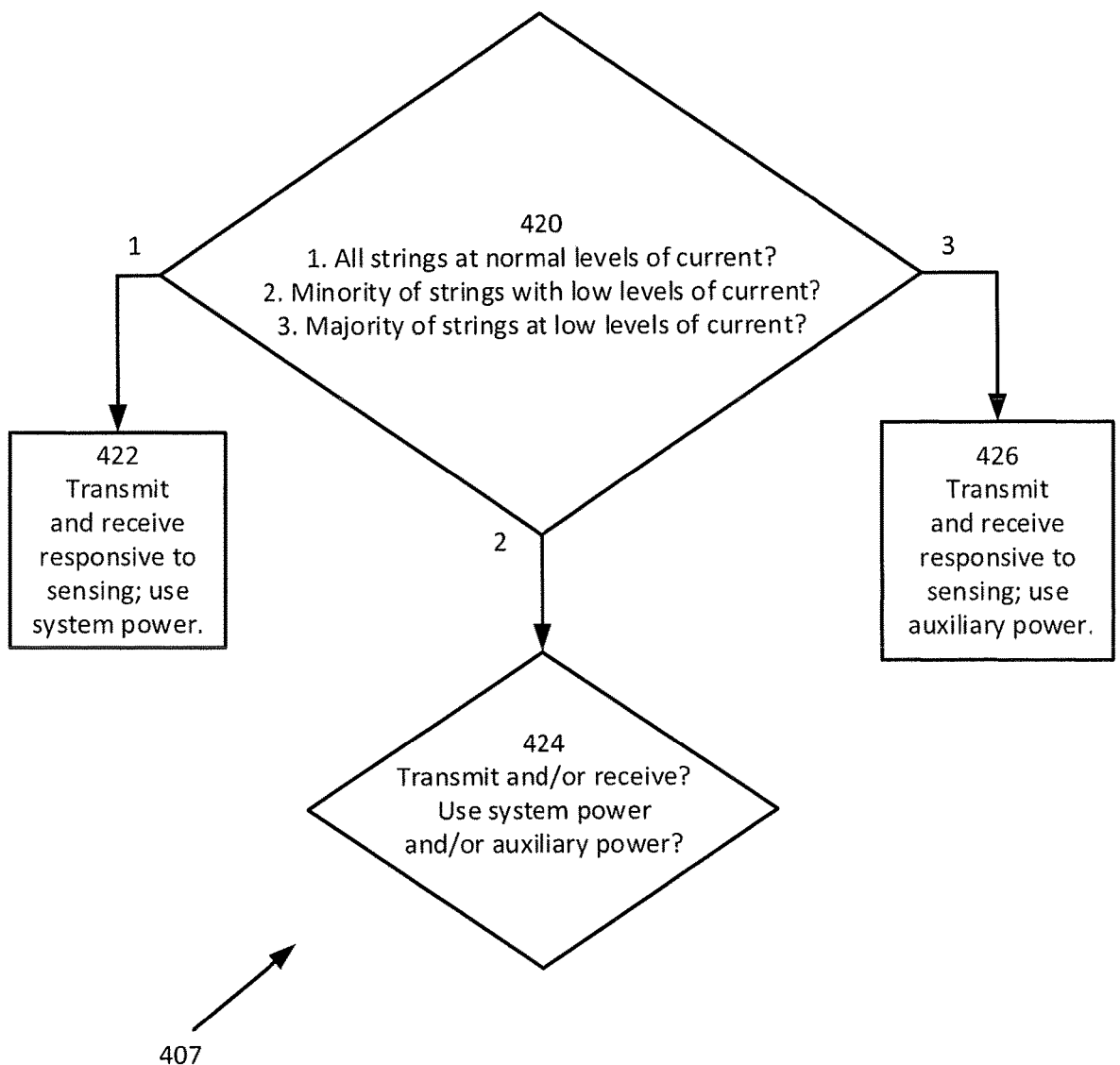
FIG. 4B shows more details of a step in the method shown in FIG. 4A, according to illustrative aspects of the disclosure.

At step 407, communication signals may be transmitted and/or received responsive the communication parameters and/or operating power parameters sensed at step 405, according to the variety of modulation schemes included in the description of step 403. To explain step 407, reference is made to FIG. 4B, which shows more details of step 407, according to illustrative aspects of the disclosure. For ease of discussion, reference is made to simplex communication over power lines 120 to form a channel that may be operated in one direction at a time. Therefore, one transceiver 20 in a transmit mode is described and one or more transceivers 20 are used in a receive mode to receive transmissions from the one transceiver 20 in the transmit mode.

At decision step 420, responsive to sensing at step 405 by sensors 204a, an indication for a control algorithm running on a controller 200 used as a central controller may give an indication that; 1.) all strings are operating at normal levels of current; 2.) a minority of strings are operating at low levels of current; and 3. a majority of strings are operating at low levels of current.

At step 422, all strings of serially connected outputs of power devices 103/103a between terminals A and B are operating at normal levels of current. Power devices 103/103a operating at normal levels of current being indicative of power sources 101 (PV generators) are fully illuminated and fully operational. Therefore, power from power system 180 may be used to provide operating power to transceivers 20 to enable transceiver 20 to transmit signals onto power lines 120 with the high Q provided from the first circuit. The first circuit controlled by controller 200 from communication parameters sensed by sensors 204a at step 405 may allow the resonant frequency ($f_{r1}$) to be selected by adaptive control and/or by robust control by virtue of capacitor C1 and/or inductor L1 being adjustable. The resonant frequency ($f_{r1}$) selected by adaptive control and/or by robust control at step 422 similarly applies to power from power system 180 used to provide operating power to transceivers 20 to enable transceivers 20 to receive signals from power lines 120 with the high Q provided from the first circuit.

At step 426, a majority of strings of serially connected outputs of power devices 103/103a between terminals A and B may be operating at low levels of current. Power devices 103/103a operating at low levels of current may be indicative of power sources 101 (PV generators) operating with low levels of illumination such as at dusk or dawn for example. Therefore, an auxiliary power from auxiliary power circuits 162/262 may be needed to provide operating power to transceivers 20 to enable transceiver 20 to transmit signals onto power lines 120 with the low Q provided from the second circuit. The auxiliary source of power may be independent from the source of power from power system 180. During dusk or dawn, sufficient operating power for the first circuit controlled by controller 200 from communication parameters sensed by sensors 204a at step 405 may not allow the resonant frequency ($f_{r1}$) to be selected by adaptive control and/or by robust control of capacitor C1 and/or inductor L1 being adjustable. The resonant frequency ($f_{r2}$) of the second circuit has a lower Q but wider band width (BW2) as shown by impedance curve 32 in FIG. 3A. Similarly, auxiliary power from auxiliary power circuits 162/262 may be needed to enable transceivers 20 to receive signals from power lines 120 with the low Q provided from the second circuit. The higher inductance value of L2 compared to inductor L1 means at the low-level currents, saturation of L2 is not an issue so that L2 may be at least made to the same standard as inductor L1 that has a lower inductance value.

At step 424, a minority of strings of serially connected outputs of power devices 103/103a between terminals A and B may be operating at low levels of current (e.g., 0 A or close to 0 A), whereas other serially connected outputs of power devices 103/103a are operating at normal levels. Power devices 103/103a operating at low levels of current may be indicative of power sources 101 (PV generators) operating with low levels of illumination because of shading of power sources, or indicative that a power device 103/103a is faulty. The faulty power devices and/or shaded power sources 101 (PV generators) may be bypassed using bypass unit Q9 as shown in FIG. 1B, in order to increase the string current. If string currents are not increased, an auxiliary power from auxiliary power circuits 162/262 may be needed to provide an operating power to transceivers 20. The operating power may enable transceiver 20 to transmit signals onto power lines 120 and/or receive signals from power lines 120 with the low Q provided from the second circuit. If as a result of the application of bypass unit Q9, the string currents are within an acceptable range, power from power system 180 may be used to provide an operating power to transceivers 20. The operating power may enable transceiver 20 to transmit signals onto power lines 120 and/or receive signals from power lines 120 with the high Q provided from the first circuit that may have the property of being adjustable.

Figure 4C:
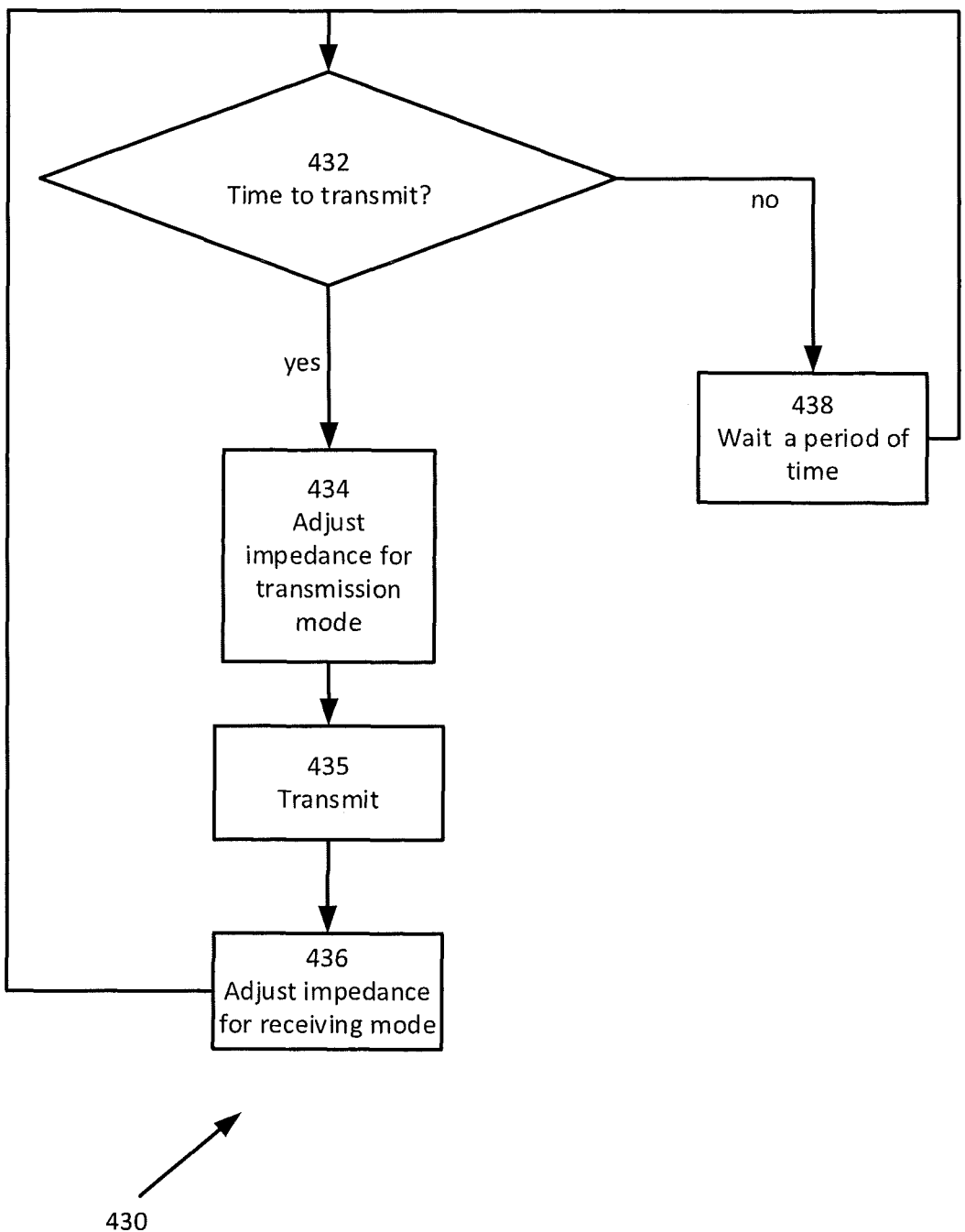
FIG. 4C shows a method for adjusting the impedance of a PLC circuit, according to illustrative aspects of the disclosure.

Reference is now made to FIG. 4C, which shows a method for adjusting the impedance of a PLC circuit in accordance with aspects herein. Method 430 may be carried out by a controller of a communication device such as communication device 110 of FIGS. 1A, 1B, communication device 117 of FIG. 1D, or communication device 110a of FIG. 1E. For illustrative purposes, reference will be made to communication device 110a of FIG. 1E having variable capacitor C1. Communication device 110a may generally be in a receiving mode for a majority of the system operation time, and may be a transmitting mode for a short period of time (e.g., tens or hundreds of milliseconds) periodically. Communication device 110a may have a first preferred impedance level while in receiving mode, and may have a second preferred impedance level while in transmitting mode. At step 432, a controller implementing method 430 may determine if it is desirable to transmit a signal (e.g., if a substantial period of time has elapsed since the last transmission). The determination may include receiving a clock measurement and/or calculating a period of time elapsed since a prior transmission. If the controller determines that it is not time to transmit a signal, the controller may proceed to step 438, wait a period of time (e.g., several seconds), and return to step 432.

If the controller determines, at step 432, that it is time to transmit a signal, the controller may proceed to step 434 and may adjust an impedance of communication device 110a to be at a preferred impedance level for transmitting. For example, capacitor C1 may be adjusted to present a different impedance level. At step 435, communication device 110a may transmit a signal (e.g., over power lines 120). After the transmission of the signal is complete, at step 436, the controller may re-adjust the impedance to be at a level preferred for receiving mode, and may then return to step 432.

As a non-limiting numerical example, communication device 110a may have L1=1 µH, C1=10 µF, $f_r$=50.3 KHz, Q=31.62, BW=1.6 KHz while in receiving mode. At step 424, capacitor C1 may be reduced to be C1=5 µF, resulting in $f_r$=71.176 KHz, Q=22.36, BW=3.2 KHz. The ability to easily shift $f_r$ having a substantial Q-factor from around 50 KHz to around 70 KHz may increase the quality of communication carried out over power lines. While not transmitting, communication devices may be operated to present a reduced impedance to other, transmitting, communication devices, reducing the total loop impedance "seen" by the transmitting communication device. The second circuit of communication device 110a having inductor L2, resistor R2 and capacitor C2 may present a constant impedance having a higher bandwidth and lower gain compared to the first, variable circuit having inductor L1, resistor R1 and capacitor C1. The second circuit may provide adequate impedance in a case where the first circuit is inoperable, which may be due to lack of availability of power for varying capacitor C1. Varying capacitor C1 may be implemented as a bank of parallel-connected capacitors that may be connected and disconnected from each other via switches as shown in FIG. 1G that may be switched responsive to step 432.

Figure 4D:
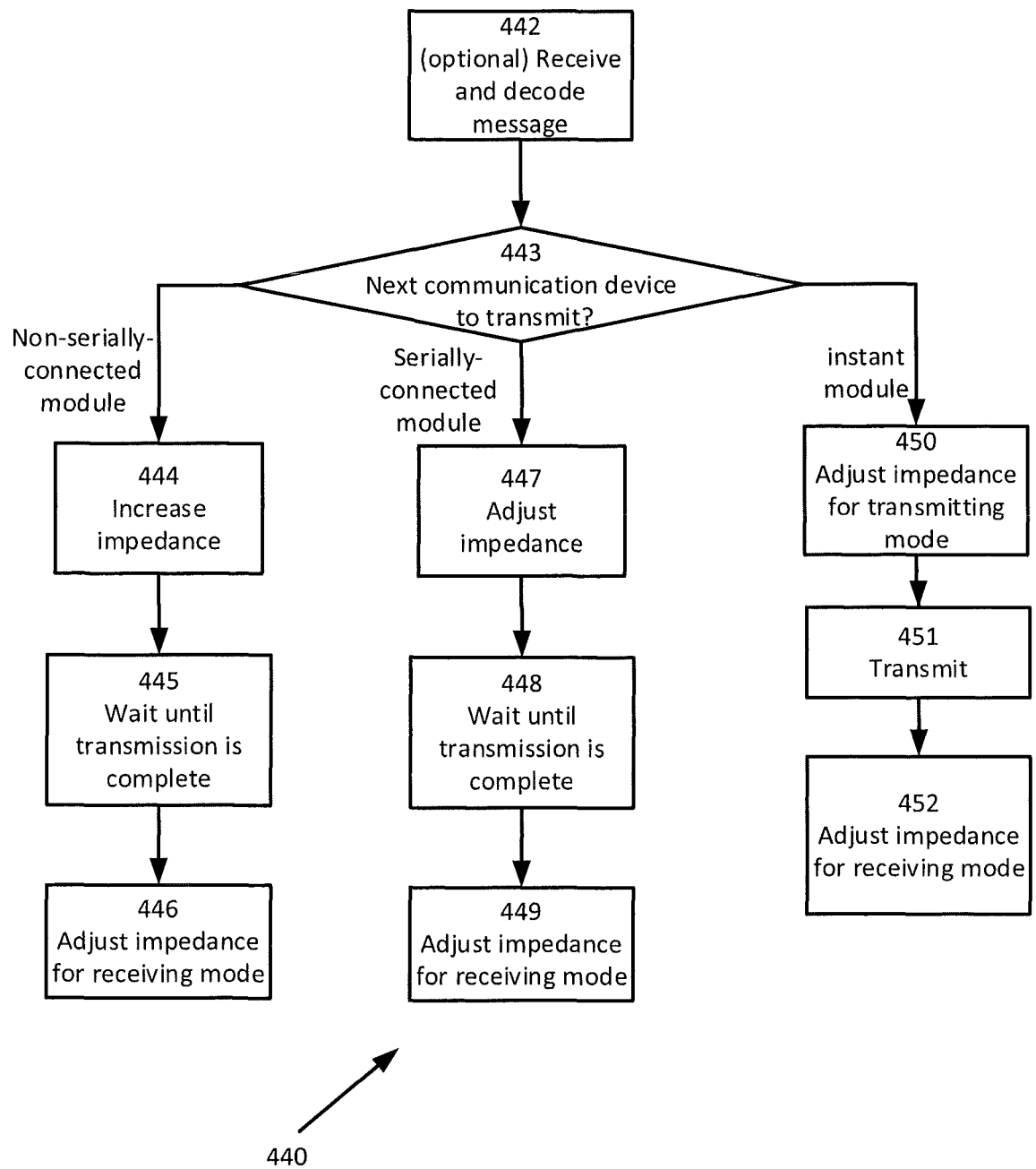
FIG. 4D shows a method for adjusting the impedance of a PLC circuit, according to illustrative aspects of the disclosure.

Reference is now made to FIG. 4D, which shows a method for adjusting the impedance of a PLC circuit in accordance with aspects herein. Method 440 may be carried out by a controller of a communication device such as communication device 110 of FIGS. 1A, 1B or communication device 110a of FIG. 1E. For illustrative purposes, reference will be made to communication device 110a of FIG. 1E having variable capacitor C1. The controller controlling capacitor C1 (e.g., by opening and closing switches S1 ... Sn of FIG. 1G) may be configured to adjust the value of capacitor C1 according to several modes of operation. In a first mode, the communication device including the controller may be transmitting. In a second mode, a communication device that is part of the same serial string as the instant controller carrying out method 440 may be transmitting. In a third mode, a communication device that is not part of the same serial string as the controller carrying out method 440 may be transmitting.

At step 442, the controller may receive and decode a message (e.g., sent by system power device 107 of FIG. 1A) indicating that a communication device is scheduled to transmit a communication. According to some aspects, step 442 might not be featured, and the controller may operate according to a predetermined time schedule indicating when various communication devices should transmit. At step 443, the controller determines which communication device is scheduled to transmit, according to the message received at step 442 and/or according to the predetermined time schedule. If the controller determines that the instant communication device (i.e., the communication device connected to the controller carrying out method 440) is the next device to transmit, the controller may proceed to step 450 and adjust (e.g., increase, or move the resonant frequency of) the impedance of an adjustable impedance circuit included in the communication device to be suitable for a transmitting mode. For example, if a message is to be transmitted at a frequency of 53 kHz, the controller may adjust capacitor C1 to be 9 µF and obtain an impedance curve similar to curve 34b of FIG. 3C. At step 451, the controller operates the communication device to transmit the message. After transmitting, at step 452, the controller adjusts the impedance to be suitable for a receiving mode of the communication device.

If the controller determines at step 443 that the next communication device to transmit is a communication device serially connected to the impedance controlled by the controller, the controller may, at step 447, adjust the impedance to provide a reduced impedance at the frequency used by the transmitting controller, to reduce in-string attenuation of the signal, or an increased impedance at the frequency used by the transmitting controller. For example, where it is desirable to receive in-string communications, the controller may increase the impedance. Where it is not desirable to receive in-string communications (e.g., where the intended recipient of the message is not in the serial string), the controller may reduce the impedance. After transmission is complete, at step 448, the controller continues to step 449 and adjusts the impedance to be in a receiving mode of the communication device.

If the controller determines at step 443 that the next communication device to transmit is a communication device not serially connected to the impedance controlled by the controller, the controller may, at step 444, adjust the impedance to provide an increased impedance at the frequency used by the transmitting controller, to reduce leakage of the signal into the string. After transmission is complete, at step 448, the controller continues to step 446 and adjusts the impedance to be in a receiving mode of the communication device.

Figure 4E:
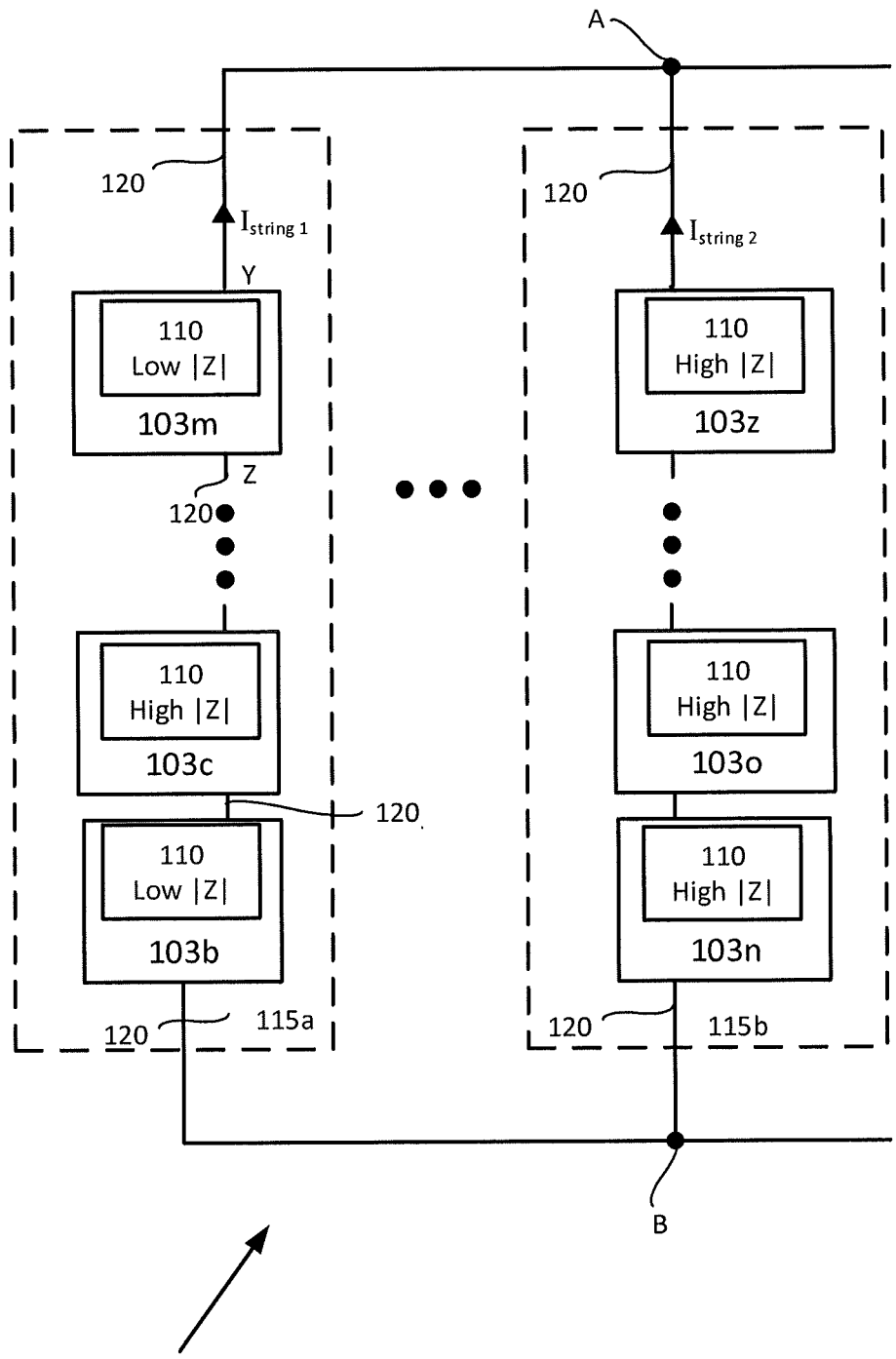
FIG. 4E shows a portion of a system while implementing an example method according to illustrative aspects of the disclosure.

Reference is now made to FIG. 4E, which shows an example portion 182 of power system 181 (not showing power sources 101, for clarity) of FIG. 1B while method 440 is being carried out. Wiring configuration 115a may comprise serially connected power devices 103b . . . 103m, and wiring configuration 115b may comprise serially connected power devices 103n . . . 103z. Each power device 103b . . . 103z may be similar to power device 103a of FIG. 1B and may include a communication device 110 having an impedance Z. Each power device may have a controller (e.g., controller 105 of FIG. 1C) configured to carry out method 440 of FIG. 4D.

FIG. 4E depicts a time in which the controllers of power devices 103b . . . 103z are carrying out method 440. It may depict a time where the communication device of power device 103c is transmitting or preparing to transmit. Prior to the time shown in FIG. 4E, the controller of power devices 103b . . . 103z determine (either by decoding a message or according to a predetermined schedule) that the communication device of power device 103c is to transmit. The controllers of power devices 103b and 103m control respective adjustable impedances to be at a low impedance level (in accordance with step 447 of method 440) as to not attenuate the transmission by power device 103c. The controller of power device 103c controls a corresponding adjustable impedance to be at a high impedance level (in accordance with step 450 of method 440) to enable an effective transmission by power device 103c, and the controllers of power devices 103n . . . 103z control respective adjustable impedances to be at a high impedance level (in accordance with step 444 of method 440) as to increase the impedance of wiring configuration 115b and reduce the leakage of the transmission by power device 103c into wiring configuration 115.

It may be noted that various connections are set forth between elements herein. These connections are described in general and, unless specified otherwise, may be direct or indirect; this specification may not intended to be limiting in this respect. Further, elements of one embodiment may be combined with elements from other aspects of the disclosure in appropriate combinations or sub-combinations. For example, each or either of methods 430 and 440 may be carried out by communication devices 110 of FIG. 1A or 1B. Impedance Z1 of FIG. 1D may be realized by any of the circuits Z1 of FIGS. 1E-1I. Furthermore, a circuit or system including more than one adjustable impedance, may feature different types of adjustable impedances (for example, a first power device may feature impedance Z1 of FIG. 1I and a second power device may feature impedance Z1 of FIG. 1G).

It is further noted various circuits disclosed herein may include elements used according to some aspects but not according to other aspects. For example, impedances Z1 and Z2 of FIG. 1D may be used independently as part of power devices featuring an adjustable impedance, and transceiver 20 and capacitor Cp may be added in power devices further featuring a communication device 110. As another example, resistor R1 and capacitor C3 may be removed from impedance Z1 of FIG. 1I. The resultant impedance Z1 may be effectively that of an inductor with a compensation circuit designed to prevent the saturation of inductor L5.

All optional and preferred features and modifications of the described aspects of the disclosure and dependent claims are usable in all aspects of the disclosure taught herein. Furthermore, the individual features of the dependent claims, as well as all optional and preferred features and modifications of the described aspects of the disclosure are combinable and interchangeable with one another.

The invention claimed is:

1. An apparatus comprising:
 a first terminal and a second terminal;
 a first impedance circuit forming a current path between the first terminal and the second terminal;
 at least one of:
  a first inductor connected in series with the first impedance circuit, or
  a first capacitor connected in parallel with the first impedance circuit; and
 a transceiver connected to the first terminal and the second terminal, and based on at least one of a communication parameter of the first impedance circuit and a level of current in the current path, configured to transmit onto the current path or to receive from the current path, a signal.

2. The apparatus of claim 1, wherein the communication parameter comprises at least one of:
 a resonant frequency of the first impedance circuit, a quality (Q) factor of a resonance corresponding to the resonant frequency, a bandwidth (BW) of the first impedance circuit, a resistance of a resistor in the first impedance circuit, or an impedance of the first impedance circuit.

3. The apparatus of claim 1, wherein the first impedance circuit comprises a second inductor, a second capacitor, and a first resistor connected in parallel.

4. The apparatus of claim 3, further comprising:
 a second impedance circuit connected between the first terminal and the second terminal, wherein the second impedance circuit is in series with the first impedance circuit, and comprises a third inductor, a third capacitor, and a second resistor connected in parallel.

5. The apparatus of claim 4, wherein the second impedance circuit is configured to provide an impedance configured to mitigate an absorption and an attenuation of a transmitted signal from a second transceiver.

6. The apparatus of claim 4, further comprising one or more sensors configured to sense a resonant frequency of the second impedance circuit, wherein a frequency of the signal corresponds to the resonant frequency of the second impedance circuit.

7. The apparatus of claim 1, further comprising:
 one or more sensors configured to sense:
  the level of current in the current path, and
  the communication parameter of the first impedance circuit; and
 an auxiliary power circuit configured to supply, based on the level of current in the current path sensed by the one or more sensors, an operating power to the transceiver.

8. The apparatus of claim 7, wherein the transceiver, based on the supply of the operating power, is configured to change a capacitance of a capacitor of the first impedance circuit.

9. The apparatus of claim 1, further comprising one or more sensors configured to sense a resonant frequency of the first impedance circuit, wherein the transceiver is further configured to transmit onto the current path or receive from the current path, the signal at a frequency responsive to the resonant frequency of the first impedance circuit sensed by the one or more sensors.

10. A method comprising:
measuring, by one or more sensors, a communication parameter of a first impedance circuit connected in a current path between a first terminal and a second terminal, wherein at least a first inductor is connected in series with the first impedance circuit or a first capacitor is connected in parallel with the first impedance circuit;
sensing, by the one or more sensors, a level of current in the current path; and
based on the communication parameter and the level of current and by a transceiver connected to the first terminal and the second terminal, transmitting onto the current path or receiving from the current path, signals.

11. The method of claim 10, wherein the first impedance circuit comprises a second inductor, a second capacitor, and a first resistor connected in parallel.

12. The method of claim 10, wherein the communication parameter comprises at least one of:
a resonant frequency of the first impedance circuit, a Q factor of a resonance corresponding to the resonant frequency, a bandwidth (BW) of the first impedance circuit, a resistance of a resistor of the first impedance circuit, an impedance of the first impedance circuit, or a standing wave ratio (SWR) of the signals transmitted onto the current path.

13. The method of claim 10, further comprising:
reducing, with the first impedance circuit, an absorption and an attenuation of transmitted signals from a second transceiver.

14. The method of claim 10, further comprising:
supplying, by an auxiliary power circuit and based on the level of current in the current path, an operating power to the transceiver, to control the transmitting onto the current path or the receiving on the current path, the signals.

15. The method of claim 14, wherein the auxiliary power circuit is independent from a power source driving a current in the current path; and
wherein the signals have frequencies that are based on resonant frequencies of the first impedance circuit sensed by the one or more sensors.

16. A method comprising forming a current path by:
connecting a first impedance circuit to a first terminal and a second terminal;
connecting at least:
a first inductor in series with the first impedance circuit, or
a first capacitor in parallel with the first impedance circuit; and
connecting a transceiver between the first terminal and the second terminal, wherein the transceiver, based on at least one of a communication parameter and a level of current in the current path, is configured to transmit onto the current path or receive from the current path, a signal.

17. The method of claim 16, wherein the communication parameter of the first impedance circuit comprises at least one of: a resonance of the first impedance circuit, a Q factor of the resonance, a bandwidth (BW) of the first impedance circuit, a resistance of a resistor in the first impedance circuit, an impedance of the first impedance circuit, or a standing wave ratio (SWR) of the signal.

18. The method of claim 16, wherein the first impedance circuit comprises a second inductor, a second capacitor, and a first resistor connected in parallel.

19. The method of claim 16, further comprising:
connecting a second impedance circuit between the first and second terminals, wherein the second impedance circuit comprises a third inductor, a third capacitor, and a third resistor connected in parallel,
wherein the second impedance circuit is connected in series with the first impedance circuit; and
wherein each of the first impedance circuit and the second impedance circuit provides an impedance for mitigating an absorption and an attenuation of transmitted signals from other transceivers.

20. The method of claim 16, further comprising:
connecting an auxiliary power circuit to the transceiver, wherein the auxiliary power circuit, based on the level of current, is configured to supply an operating power to the transceiver for controlling the transmitting onto the current path or the receiving on the current path, the signal.

21. The apparatus of claim 1, further comprising:
one or more sensors configured to sense:
the level of current in the current path, and
the communication parameter of the first impedance circuit.

22. The method of claim 16, further comprising:
connecting one or more sensors between the first terminal and the second terminal, wherein the one or more sensors are configured to sense:
the communication parameters of the first impedance circuit; and
the level of current in the current path between the first terminal and the second terminal.

* * * * *